(12) United States Patent
Huang et al.

(10) Patent No.: US 12,087,733 B2
(45) Date of Patent: Sep. 10, 2024

(54) PACKAGES WITH MULTIPLE TYPES OF UNDERFILL AND METHOD FORMING THE SAME

(71) Applicant: Taiwan Semiconductor Manufacturing Co., Ltd., Hsinchu (TW)

(72) Inventors: Kuan-Yu Huang, Taipei (TW); Li-Chung Kuo, Taipei (TW); Sung-Hui Huang, Dongshan Township (TW); Shang-Yun Hou, Jubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/383,911

(22) Filed: Jul. 23, 2021

(65) Prior Publication Data
US 2022/0367413 A1    Nov. 17, 2022

Related U.S. Application Data

(60) Provisional application No. 63/188,167, filed on May 13, 2021.

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/3185* (2013.01); *H01L 23/49833* (2013.01); *H01L 24/32* (2013.01); *H01L 24/33* (2013.01); *H01L 24/73* (2013.01); *H01L 24/92* (2013.01); *H01L 25/50* (2013.01); *H01L 25/18* (2013.01); *H01L 2224/32057* (2013.01); *H01L 2224/33051* (2013.01); *H01L 2224/33152* (2013.01); *H01L 2224/3316* (2013.01); *H01L 2224/73204* (2013.01); *H01L 2224/9211* (2013.01); *H01L 2224/92125* (2013.01)

(58) Field of Classification Search
None
See application file for complete search history.

(56) References Cited

U.S. PATENT DOCUMENTS

| | | | |
|---|---|---|---|
| 6,356,453 B1 * | 3/2002 | Juskey | H01L 21/561 257/737 |
| 6,546,620 B1 * | 4/2003 | Juskey | H01L 24/81 29/841 |

(Continued)

FOREIGN PATENT DOCUMENTS

| | | | | |
|---|---|---|---|---|
| CN | 105283948 A | * | 1/2016 | ......... C08G 59/4215 |
| JP | 2000286302 A | * | 10/2000 | |

(Continued)

*Primary Examiner* — Telly D Green
(74) *Attorney, Agent, or Firm* — Slater Matsil, LLP

(57) ABSTRACT

A method includes bonding a first package component over a second package component, dispensing a first underfill between the first package component and the second package component, and bonding a third package component over the second package component. A second underfill is between the third package component and the second package component. The first underfill and the second underfill are different types of underfills.

19 Claims, 34 Drawing Sheets

(51) Int. Cl.
*H01L 23/31* (2006.01)
*H01L 23/498* (2006.01)
*H01L 25/00* (2006.01)
*H01L 25/18* (2023.01)

(56) References Cited

U.S. PATENT DOCUMENTS

| | | | |
|---|---|---|---|
| 7,915,080 B2 * | 3/2011 | Takahashi | H01L 21/6835 257/E21.705 |
| 8,993,380 B2 | 3/2015 | Hou et al. | |
| 9,006,004 B2 | 4/2015 | Lin et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,673,124 B2 | 6/2017 | Wang et al. | |
| 9,735,131 B2 | 8/2017 | Su et al. | |
| 10,090,234 B2 | 10/2018 | Kelly et al. | |
| 11,075,133 B2 | 7/2021 | Chen et al. | |
| 11,114,364 B2 | 9/2021 | Kim et al. | |
| 11,527,503 B2 | 12/2022 | Kyung et al. | |
| 11,646,275 B2 | 5/2023 | Lee | |
| 2004/0262774 A1 | 12/2004 | Kang et al. | |
| 2005/0093144 A1 | 5/2005 | Brandenburg et al. | |
| 2005/0122697 A1 | 6/2005 | Workman et al. | |
| 2005/0196907 A1 * | 9/2005 | Ratificar | H01L 25/0657 438/126 |
| 2007/0178627 A1 * | 8/2007 | Jiang | H01L 24/31 438/108 |
| 2010/0093135 A1 * | 4/2010 | Lii | H01L 23/295 257/E21.502 |
| 2013/0127025 A1 * | 5/2013 | Cho | H01L 25/16 257/E23.114 |
| 2013/0249532 A1 * | 9/2013 | Lin | H01L 24/92 257/774 |
| 2015/0214190 A1 * | 7/2015 | Lin | H01L 25/18 257/676 |
| 2016/0079201 A1 * | 3/2016 | Do | H01L 24/81 29/830 |
| 2016/0181218 A1 * | 6/2016 | Karhade | H01L 25/0657 257/737 |
| 2017/0092634 A1 | 3/2017 | Yu et al. | |
| 2017/0178985 A1 * | 6/2017 | Sato | H01L 23/04 |
| 2018/0068978 A1 * | 3/2018 | Jeng | H01L 25/50 |
| 2018/0138116 A1 * | 5/2018 | Lin | H01L 23/49816 |
| 2018/0138155 A1 * | 5/2018 | Kim | H01L 25/50 |
| 2018/0323170 A1 * | 11/2018 | Kim | H01L 21/4853 |
| 2019/0139845 A1 * | 5/2019 | Lin | H01L 23/3114 |
| 2019/0221520 A1 * | 7/2019 | Kim | H01L 24/06 |
| 2019/0333910 A1 * | 10/2019 | Shin | H01L 24/06 |
| 2019/0385977 A1 * | 12/2019 | Elsherbini | H01L 25/16 |
| 2020/0006181 A1 * | 1/2020 | Chen | H01L 25/0657 |
| 2020/0091128 A1 * | 3/2020 | Elsherbini | H01L 24/17 |
| 2020/0203186 A1 * | 6/2020 | Huang | H01L 25/50 |
| 2020/0312789 A1 * | 10/2020 | Kim | H01L 23/367 |
| 2020/0335480 A1 * | 10/2020 | Hwang | H01L 23/3675 |
| 2020/0388549 A1 * | 12/2020 | Kim | H01L 23/3128 |
| 2020/0395313 A1 | 12/2020 | Mallik et al. | |
| 2021/0035859 A1 * | 2/2021 | Mehta | H01L 21/76804 |
| 2021/0111153 A1 * | 4/2021 | Lin | H01L 21/563 |
| 2021/0125946 A1 * | 4/2021 | Huang | H01L 21/561 |
| 2021/0125968 A1 | 4/2021 | Yu et al. | |
| 2021/0202389 A1 * | 7/2021 | Hsieh | H01L 23/5385 |
| 2021/0249952 A1 * | 8/2021 | Roth | H02M 3/003 |
| 2021/0257275 A1 * | 8/2021 | Park | H01L 23/3675 |
| 2021/0296198 A1 * | 9/2021 | Im | H01L 23/552 |
| 2021/0305122 A1 * | 9/2021 | Lai | H01L 21/563 |
| 2021/0358866 A1 * | 11/2021 | Choi | H01L 25/0655 |
| 2021/0384100 A1 * | 12/2021 | Ryu | H01L 24/32 |
| 2022/0013474 A1 * | 1/2022 | Yoo | H01L 23/49833 |
| 2022/0013496 A1 * | 1/2022 | Park | H01L 21/563 |
| 2022/0157727 A1 * | 5/2022 | Farooq | H01L 23/5385 |

FOREIGN PATENT DOCUMENTS

| | | | |
|---|---|---|---|
| JP | 2017112241 A | | 6/2017 |
| JP | 2019153767 A | * | 9/2019 |
| KR | 20190091752 A | | 8/2019 |
| KR | 20190129665 A | * | 11/2019 |
| KR | 20200094097 A | | 8/2020 |
| TW | 201541600 A | | 11/2015 |
| TW | 201606887 A | | 2/2016 |
| TW | 201816901 A | | 5/2018 |
| TW | 202002190 A | | 1/2020 |
| TW | 202006906 A | | 2/2020 |
| TW | 202101692 A | | 1/2021 |

* cited by examiner

PACKAGES WITH MULTIPLE TYPES OF UNDERFILL AND METHOD FORMING THE SAME

PRIORITY CLAIM AND CROSS-REFERENCE

This application claims the benefit of the following provisionally filed U.S. patent application: Application No. 63/188,167, filed on May 13, 2021, and entitled "Novel Underfill for Advanced Chiplet Structure," which application is hereby incorporated herein by reference.

BACKGROUND

Integrated circuit packages may have a plurality of package components such as device dies and package substrates bonded together, in order to increase the functionality and integration level. Due to the difference between different materials of the plurality of package components, warpage may occur. With the increase in the size of the packages, warpage become more severe.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
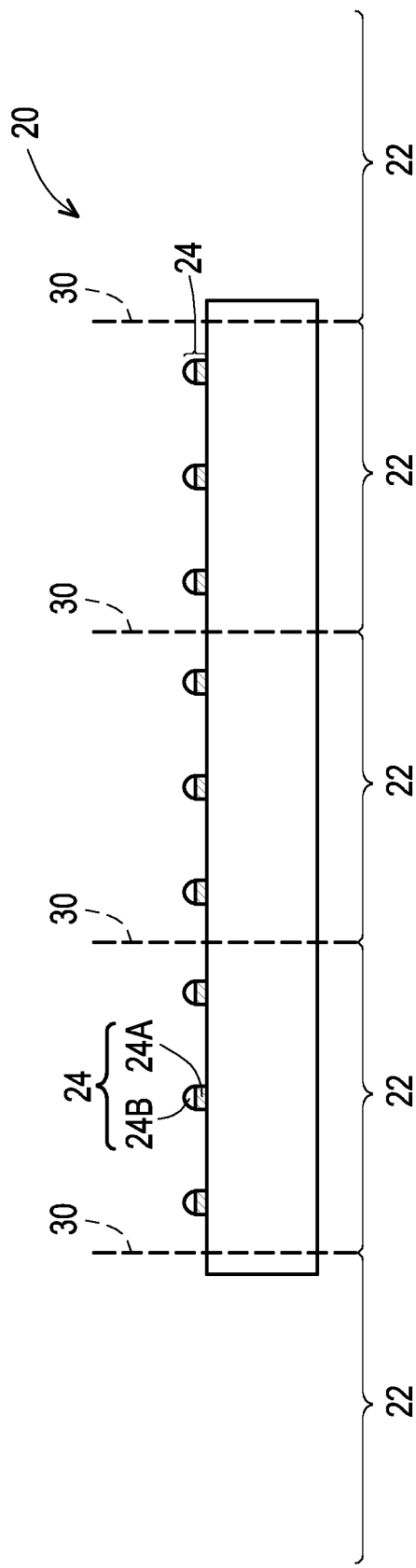
FIGS. 1-12, 13A, 13B, and 13C illustrate the cross-sectional views of intermediate stages in the formation of a package including multiple types of underfills in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including multiple types of underfills and the method of forming the same are provided. In accordance with some embodiments of the present disclosure, a plurality of package components such as device dies and packages are bonded to another package component such as an interposer. A first type of underfill and a second type of underfill, which are different from each other, are dispensed underlying a first one and a second one of the plurality of package components. The different underfills may be selected from a Non-Conductive Film (NCF), a capillary underfill, a molding underfill, and the like. By adopting different types of underfills, the warpage of packages is reduced, and the difficulty in the filling of gaps underlying large package components is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In subsequent discussion, a plurality of types of underfills such as NCF, capillary underfill, and molding underfill are adopted in various embodiments. The properties of some of these types of underfills are discussed herein. These underfills may include similar materials. These differences are more distinguishable through comparison, and through their usage, which will also be discussed in the description of the subsequently discussed processes. In accordance with some embodiments, each of the underfills (NCF, capillary underfill, and molding underfill) may include a base material, and may or may not include a filler, which may be in the form of filler particles mixed in the base material. The base material may be a resin, an epoxy, and/or a polymer. Some example base materials include epoxy-amine, epoxy anhydride, epoxy phenol, isocyanate ester, acrylate, methacrylate, polyester, polyacrylonitrile, or the like, or the combinations thereof. The filler is dielectric, and may include silica, alumina, boron nitride, or the like, which may be in the form of spherical particles.

In accordance with some embodiments, capillary underfills are dispensed in the form of flowable materials and are then cured as solid. The filler particles in the capillary underfills may also include different sizes/diameters, which may be in the range between about 0.1 µm and about 20 µm. The volume percent of the filler may range between 0 percent and about 80 percent. Capillary underfills may have Coefficient of Thermal Expansion (referred to as CTE1, measured below the corresponding glass transition temperature) in the range between about 15 ppm and about 50 ppm. The capillary underfills may also have CTEs (referred to as CTE2, measured above the corresponding glass transition temperature) in the range between about 50 ppm and about 250 ppm. The modulus values of the capillary underfills (at temperatures lower than the corresponding glass transition temperature) may be in the range between about 2 GPa and about 15 GPa, while their modulus values (measured at temperatures above the corresponding glass transition temperature) may be in the range between about 0.01 GPa and about 0.5 GPa. The glass transition temperatures of capillary underfills may be in the range between about 60° C. and about 250° C. The Viscosity of capillary underfills (at 25° C.) may be in the range between about 2 Pa·s and about 100 Pa·s. The Viscosity of NCFs at (100° C.) may be in the range between about 0.01 Pa·s and about 0.3 Pa·s.

In accordance with some embodiments, NCFs are solid films when used. The filler particles in the NCFs may also include different sizes/diameters, which may be in the range between about 0.1 µm and about 20 µm. The volume percent of the filler may range between 0 percent and about 60 percent. The NCFs may have their CTE1 values (measured below the corresponding glass transition temperature) in the range between about 20 ppm and about 70 ppm. The NCFs may also have CTE2 values (measured above the corresponding glass transition temperature) in the range between about 60 ppm and about 250 ppm. The modulus values of the NCFs (measured at temperatures lower than the corresponding glass transition temperature) may be in the range between about 1 GPa and about 10 GPa, while their modulus values (measured at temperatures above the corresponding glass transition temperature) may be in the range between about 0.01 GPa and about 0.5 GPa. The glass transition temperatures of NCFs may be in the range between about 60° C. and about 250° C.

In accordance with some embodiments, molding underfills are flowable when dispensed to form packages, and are then cured as solid. The filler particles in the molding underfills may also include different sizes/diameters, which may be in the range between about 0.1 µm and about 20 µm. The volume percent of the filler may range between 0 percent and about 97 percent. Capillary underfills may have CTE1 values (measured at temperatures below the corresponding glass transition temperature) in the range between about 3 ppm and about 30 ppm. The molding underfills may also have CTE2 values (measured above the corresponding glass transition temperature) in the range between about 10 ppm and about 100 ppm. The modulus values of the molding underfills (measured at temperatures lower than the corresponding glass transition temperature) may be in the range between about 5 GPa and about 30 GPa, while their modulus values (measured at temperatures above the corresponding glass transition temperature) may be in the range between about 0.1 GPa and about 2 GPa. The glass transition temperatures of molding underfills may be in the range between about 100° C. and about 250° C. The Viscosity of molding underfills (at 25° C.) may be in the range between about 50 Pa·s and about 1,000 Pa·s.

Figure 2:
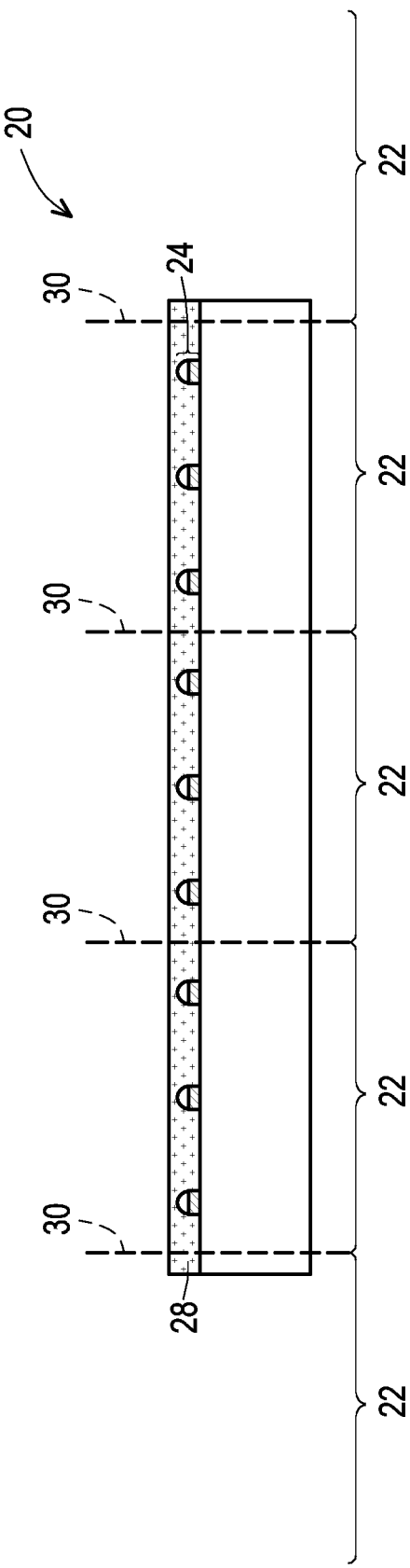
Figure 4:
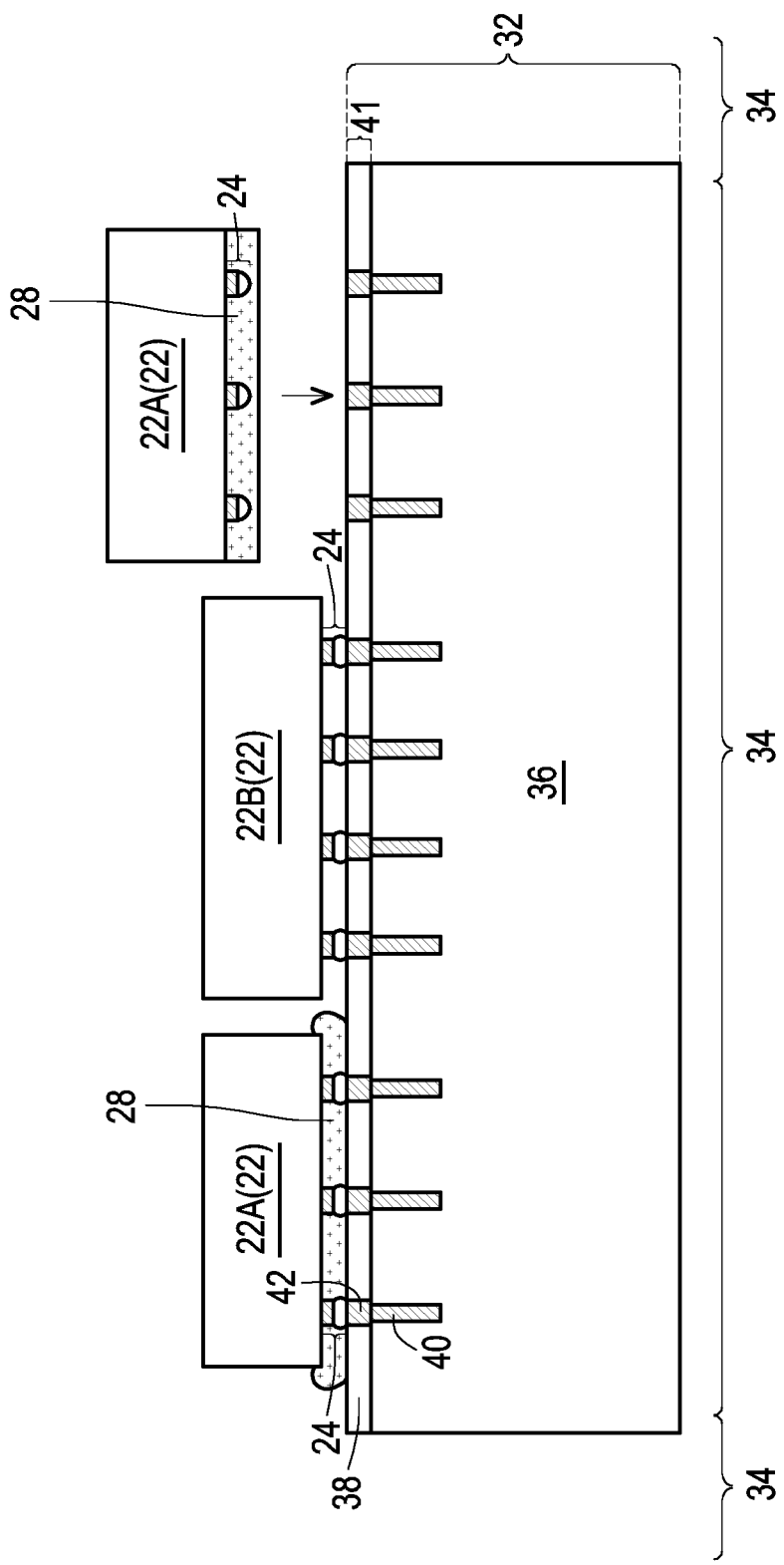

In accordance with some embodiments, when two or more of a capillary underfill, an NCF, and/or a molding underfill are used in a same package, although these underfills may (or may not) include same materials, their compositions such as the types of base materials, the type of the fillers, and/or the percentages of the base materials and the fillers are different from each other. Accordingly, properties of different underfills are different from each other. For example, the CTE of an NCF may be greater than the CTE of the (cured) capillary underfill, which is further greater than the CTE of the (cured) molding underfill. The viscosity of the molding underfill is higher than the viscosity of the capillary underfill. Accordingly, capillary underfills may be used to fill small gaps and the gaps underlying large package components, while molding underfill may be used to fill larger gaps and may be used to surround package components. Because NCFs are pre-applied before bonding (as shown in FIGS. 2 and 4), NCFs may also be used for filling small gaps and the gaps underlying large package components. The volume percentage of the filler in the molding underfill may be greater than the volume percentage of the filler in the capillary underfill, which may also be greater than the volume percentage of the filler in the NCF. The modulus of the molding underfill may be greater than the modulus values of capillary underfills and the NCFs.

FIGS. 1-12, 13A, 13B, and 13C illustrate the cross-sectional views of intermediate stages in the formation of a package including multiple types of underfills in accordance with some embodiments. The corresponding processes are also reflected schematically in the process flow shown in FIG. 31.

Referring to FIG. 1, wafer 20 is formed, which includes a plurality of package components 22 therein. Wafer 20 may be a device wafer, a reconstructed wafer (with device dies packaged therein), or the like. Each of package components 22 may be a device die, a package with a device die(s) packaged therein, a System-on-Chip (SoC) die including a plurality of integrated circuits (or device dies) integrated as a system, or the like. The device dies in package components 22 may be or may comprise logic dies, memory dies, input-output dies, Integrated Passive Devices (IPDs), or the like, or combinations thereof. For example, the logic device dies in package components 22 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 22 may include Static Random Access Memory (SRAM) dies, Dynamic Random Access Memory (DRAM) dies, or the like. For example, package components 22 may include High-Performance Memory (HBM) stacks, which may include memory dies forming a die stack, and an encapsulant (such as a molding compound) encapsulating the memory dies. The device dies in package components 22 may include semiconductor substrates and interconnect structures.

Electrical connectors 24 are formed at a top surface of wafer 20. In accordance with some embodiments, electrical connectors 24 may include non-solder metal features 24A, which may include metal pads, metal pillars, or the like, and solder regions 24B over the non-solder metal features 24A. In accordance with some embodiments, wafer 20 is singulated, for example, by sawing wafer 20 through scribe lines 30, so that package components 22 are separated from each other.

Figure 31:
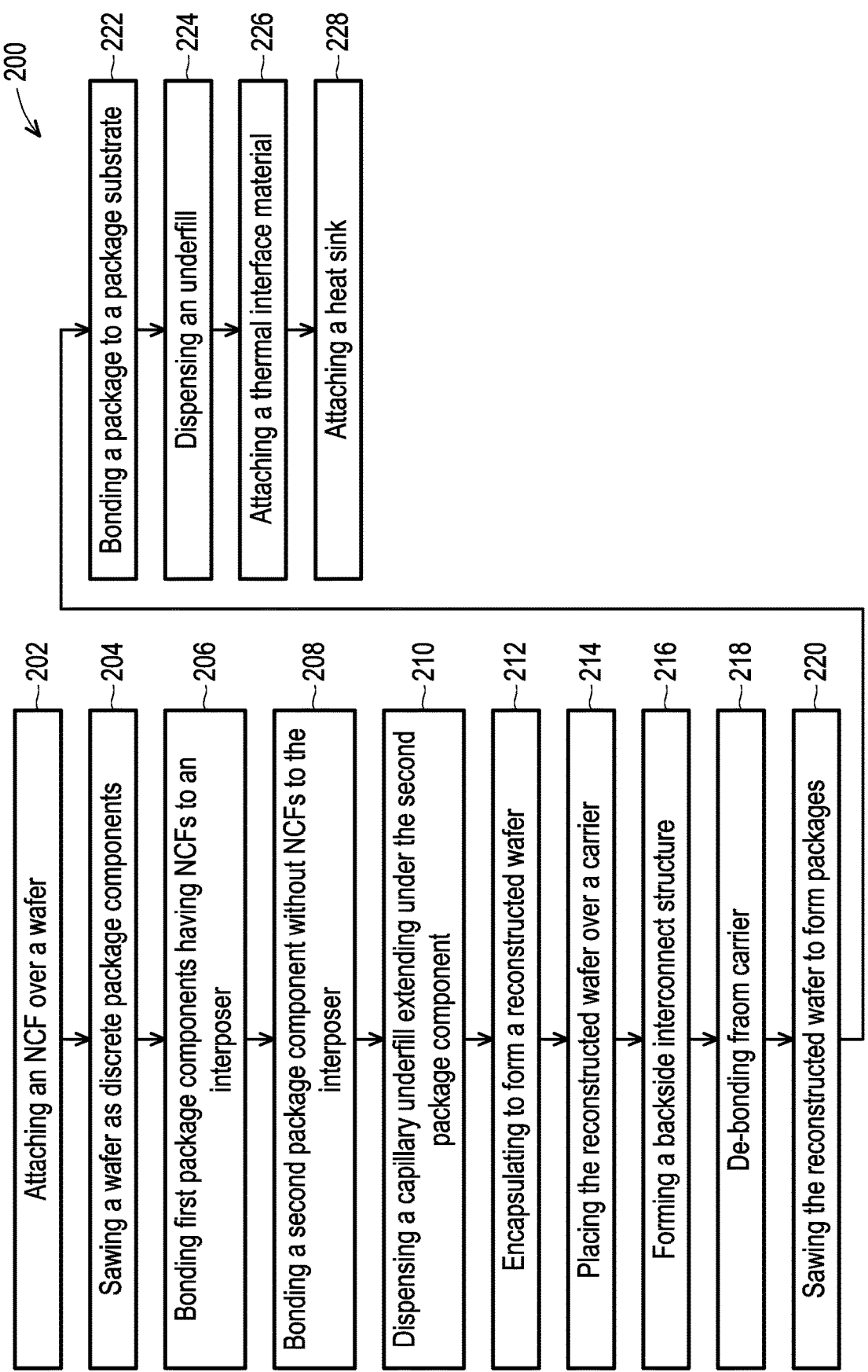
FIG. 31 illustrates a process flow for forming a package in accordance with some embodiments.

In accordance with alternative embodiments, wafer 20 is not singulated at this stage. Rather, as shown in FIG. 2, NCF 28 is attached (laminated) over wafer 20. The respective process is illustrated as process 202 in the process flow 200 as shown in FIG. 31. In accordance with some embodiments, NCF 28 is a pre-formed solid (and flexible) film, which is adhered onto wafer 20, for example, by pressing NCF 28 against wafer 20. Electrical connectors 24 are thus pressed into NCF 28. In accordance with alternative embodiments, NCF 28 is dispensed onto wafer 20 as a flowable material, and is then cured as a solid film. NCF 28 may embed electrical connectors 24 therein, with the top surface of NCF 28 being higher than the top ends of electrical connectors 24. In accordance with some embodiments, after the attachment of NCF 28, wafer 20 is singulated along with NCF 28, for example, by sawing wafer 20 through scribe lines 30. The respective process is illustrated as process 204 in the process flow 200 as shown in FIG. 31. Accordingly, as shown in FIGS. 1 and 2, the singulated package components 22 may or may not include NCF 28.

Figure 3:
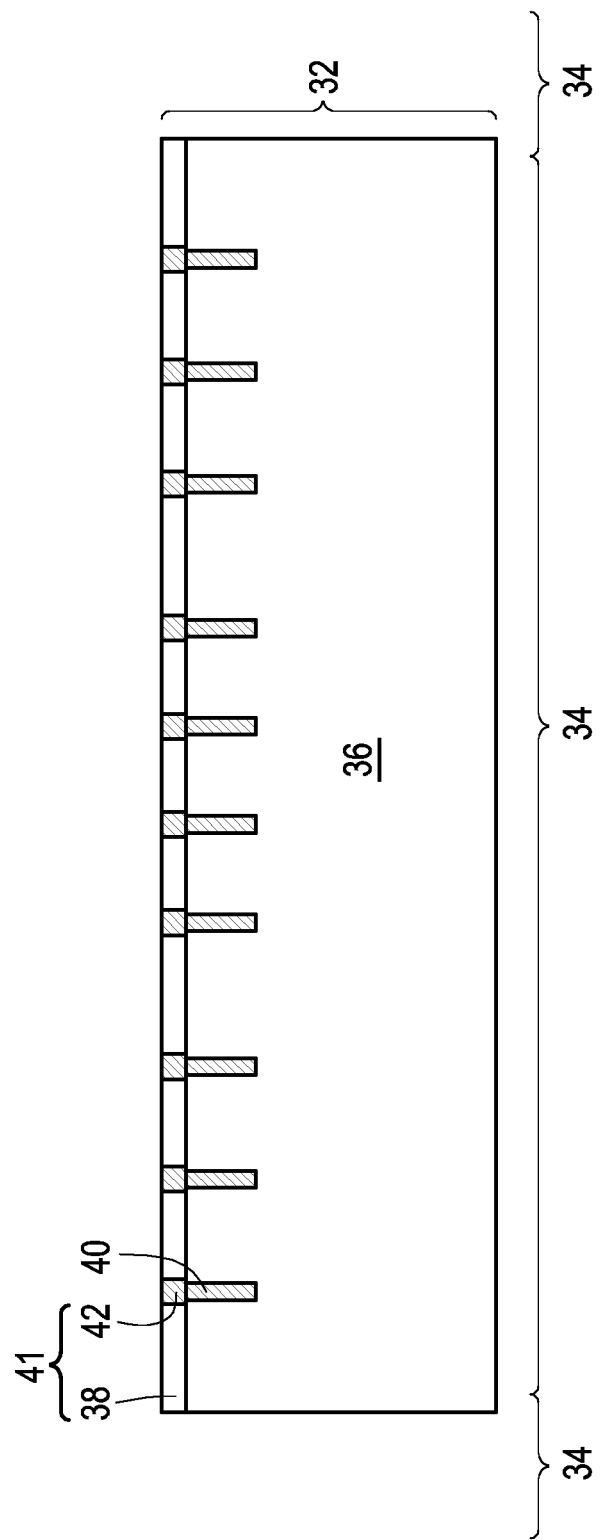

Referring to FIG. 3, package component 32 is provided, which includes package components 34 therein. Package component 32 may be a wafer. In accordance with some embodiments, package component 32 includes substrate 36, and an interconnect structure 41 over substrate 36. In accordance with some embodiments, substrate 36 is a semiconductor substrate, which may be a silicon substrate. In accordance with alternative embodiments, substrate 36 is a dielectric substrate. The interconnected structure 41 may include a plurality of dielectric layers and conductive features (such as metal lines, vias, bond pads, and the like) therein. The dielectric layers and the conductive features are represented using dielectric layers 38 and bond pads 42, respectively.

In accordance with some embodiments, package component 32 includes an interposer wafer. Package components 34 thus may also be referred to as interposers 34, which may include through-vias 40 extending into semiconductor substrate 36. In accordance with other embodiments, package component 32 is of another type such as a reconstructed wafer, a package substrate strip, or the like. Corresponding, package components 34 may be packages, package substrates, or the like. In subsequent discussion, package components 34 are referred to as interposers as an example, while they may also be of other types.

Referring to FIG. 4, package components 22 are bonded to package component 34. Although one group of package components 22 is illustrated, there may also be a plurality of groups of package components 22 attached, with each group being attached to the corresponding package component 34. Each of the package components 22 may have any of the structures and circuits as aforementioned, and the structures of the package components 22 in the same group may be the same as each other or different from each other. Each of the package components 22 may thus be selected from a device wafer, a package, an IPD, or the like, as aforementioned. Some of the package components (denoted as 22A) have NCFs 28 attached thereon. Accordingly, package components 22A are pressed against interposers 34, so that electrical connectors 24 penetrate through the corresponding NCFs 28 to contact electrical connectors 42. NCFs 28 may be squeezed out of the gaps between the corresponding overlying package components 22 and the underlying interposer 34. In accordance with some embodiments, some package components (denoted as 22B) do not have NCFs attached to them. Throughout the description, letters A, B, and C may be used to distinguish package components from each other. The letters are used to distinguish what types of underfills will be underlying them, and are not used to distinguish the types/circuits of the package components.

Figure 5:
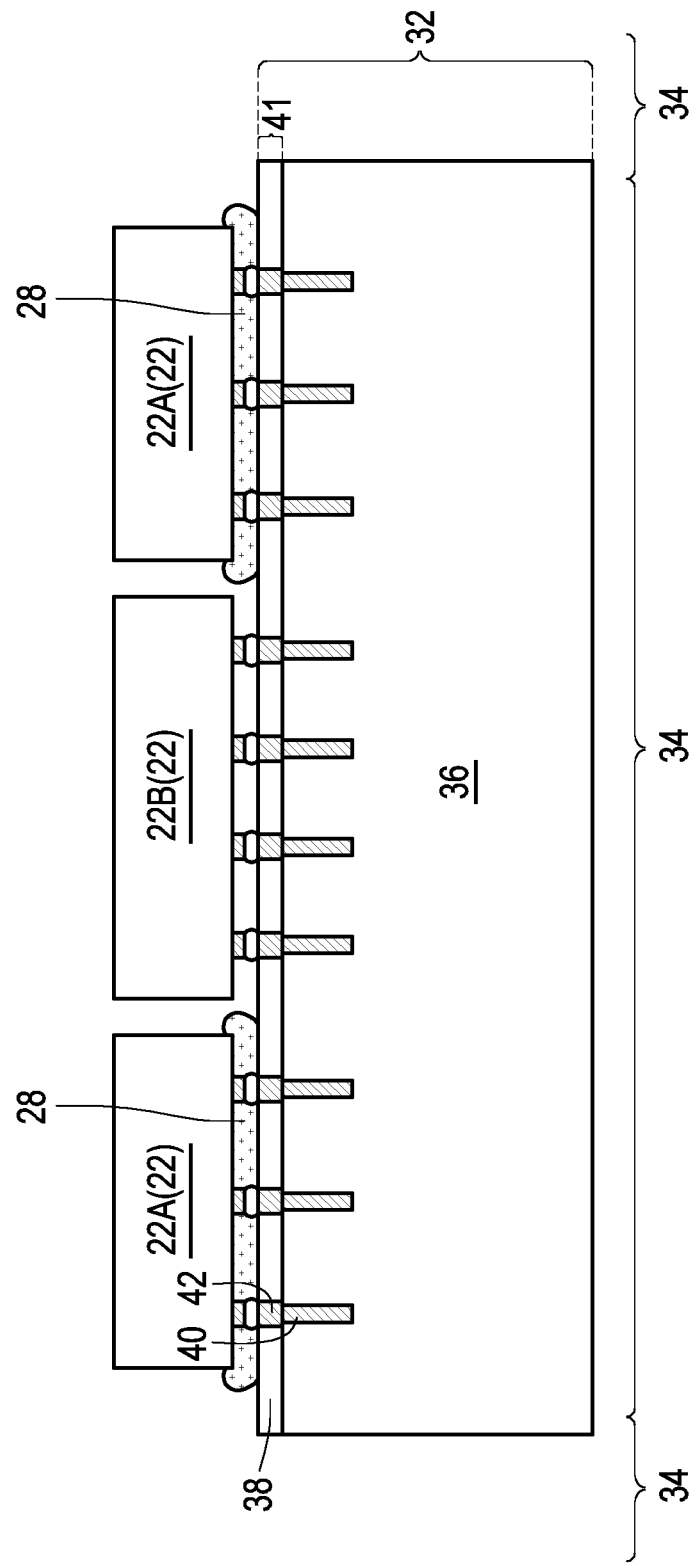

The bonding process includes attaching package components 22A and 22B over the corresponding package components 34. Next, as shown in FIG. 5, a reflow process is performed to bond package components 22A and 22B to interposers 34. The respective processes for bonding package components 22A and 22B are illustrated as processes 206 and 208 in the process flow 200 as shown in FIG. 31. Due to the pressing and further due to the heating in the reflow process, the portions of NCFs 28 outside of the gaps may have convex/rounded top surfaces and sidewalls.

Figure 6:
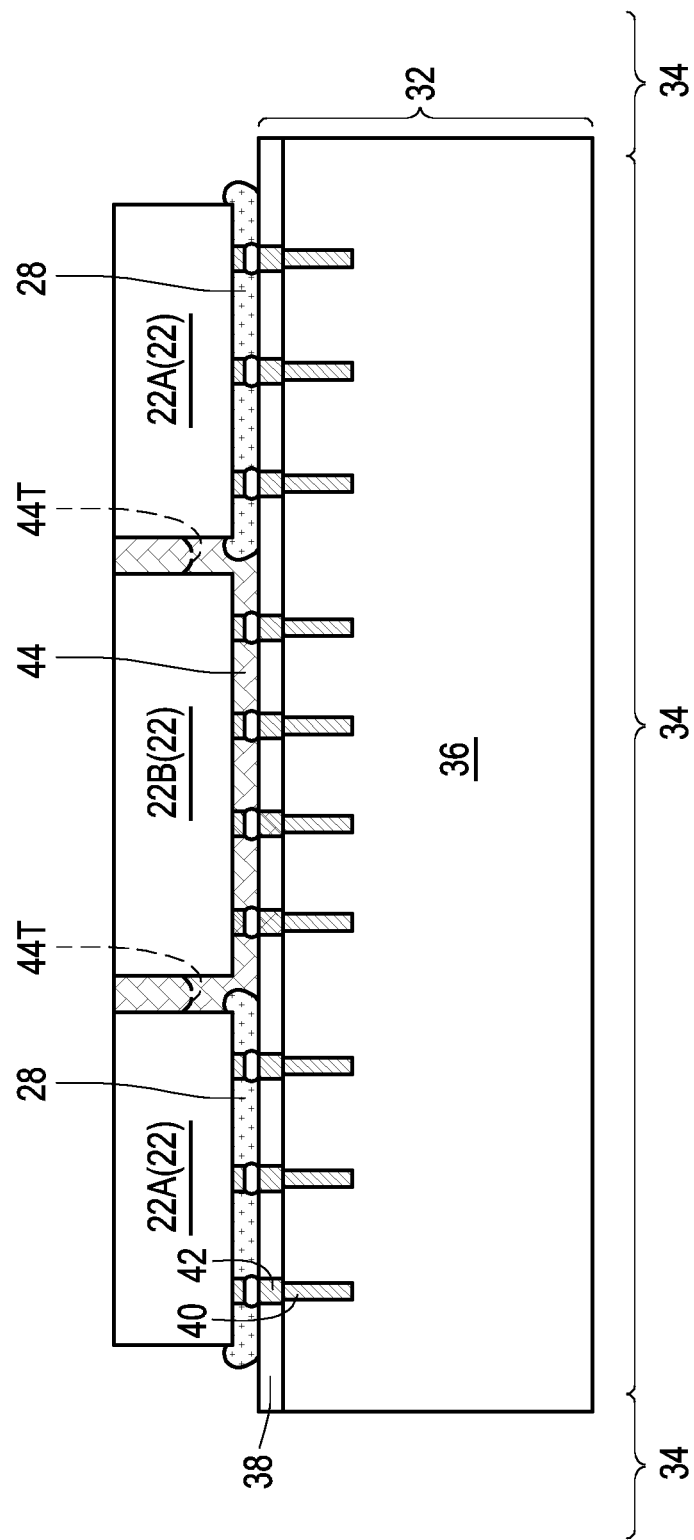

Referring to FIG. 6, capillary underfill 44 is dispensed and then cured. The respective process is illustrated as process 210 in the process flow 200 as shown in FIG. 31. Through capillary, capillary underfill 44 flows to the gap between package component 22B and interposer 22, and climb up the gaps between neighboring package components 22 when the gaps are narrow, for example, smaller than about 300 µm. When the gaps are wide, such as wider than about 300 µm, the capillary underfill 44 may not be able to climb up to the top surfaces of package component 22B. Dashed lines 44T schematically illustrate the top surfaces of the corresponding capillary underfill 44. Due to the shrinking occurring in the curing, capillary underfill 44 may have concave sidewall surfaces, as may be found referring to FIG. 13C.

Figure 7:
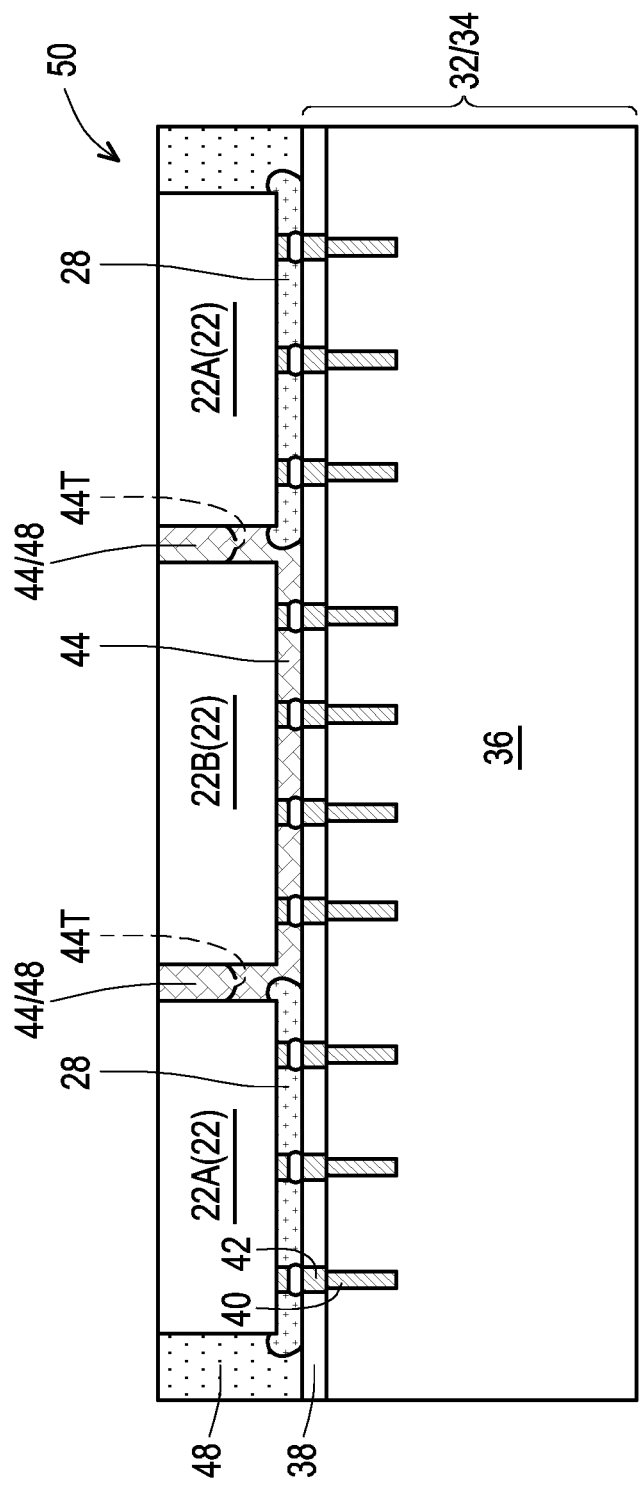

FIG. 7 illustrates the encapsulation of the package components 22 in encapsulant 48. The respective process is illustrated as process 212 in the process flow 200 as shown in FIG. 31. Encapsulant 48 may also include a base material and a filler. In accordance with some embodiments, encapsulant 48 comprises a molding compound, which may be formed of a different material (such as a different base material and/or a different filler) than capillary underfill 44. Encapsulant 48 may have a higher viscosity than both of capillary underfill and molding underfill, as discussed in preceding paragraphs. In accordance with alternative embodiments, encapsulant 48 is formed of or comprises a molding underfill, which is discussed in previous paragraphs, and hence its material and property are not repeated. In accordance with some embodiments in which the top surfaces of capillary underfill 44 are lower than the top surfaces of package components 22, as shown by dashed top surfaces 44T, encapsulant 48 may also fill the upper parts of the gaps, which upper parts are higher than top surfaces 44T. Accordingly, the features filling the upper parts of the gaps are marked as 44/48 to indicate that these regions may comprise underfill 44 or encapsulant 48.

After encapsulant 48 is dispensed, a curing process is performed to solidify encapsulant 48. In accordance with alternative embodiments, capillary underfill 44 and encapsulant 48 are cured in a same curing process. A planarization process such as a Chemical Mechanical Polish (CMP) process or a mechanical polishing process is performed to remove excess portions of encapsulant 48 over package components 22. The substrates (such as semiconductor substrates) of package components 22 may be exposed. The resulting structure is referred to as reconstructed wafer 50.

Figure 8:
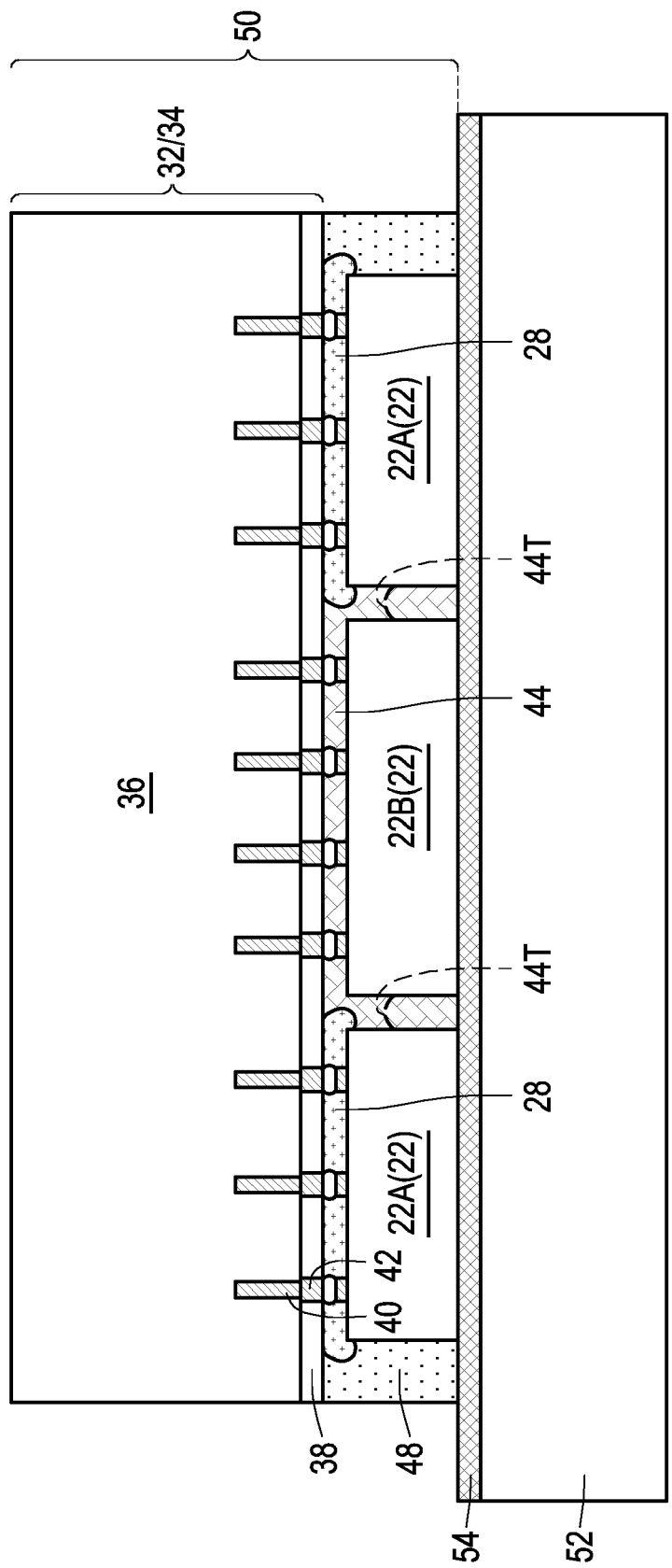

Referring to FIG. 8, reconstructed wafer 50 is placed over carrier 52. The respective process is illustrated as process 214 in the process flow 200 as shown in FIG. 31. Carrier 52 may be a glass carrier, an organic carrier, or the like. Release film 54 is coated on carrier 52 for attaching reconstructed wafer 50 to carrier 52. Release film 54 may be formed of a polymer-based material (such as a Light-To-Heat-Conversion (LTHC) material), which may be removed along with carrier 52 from reconstructed wafer 50 in subsequently processes. In accordance with some embodiments of the present disclosure, release film 54 comprises an epoxy-based thermal-release material, which is coated onto carrier 52.

Figure 9:
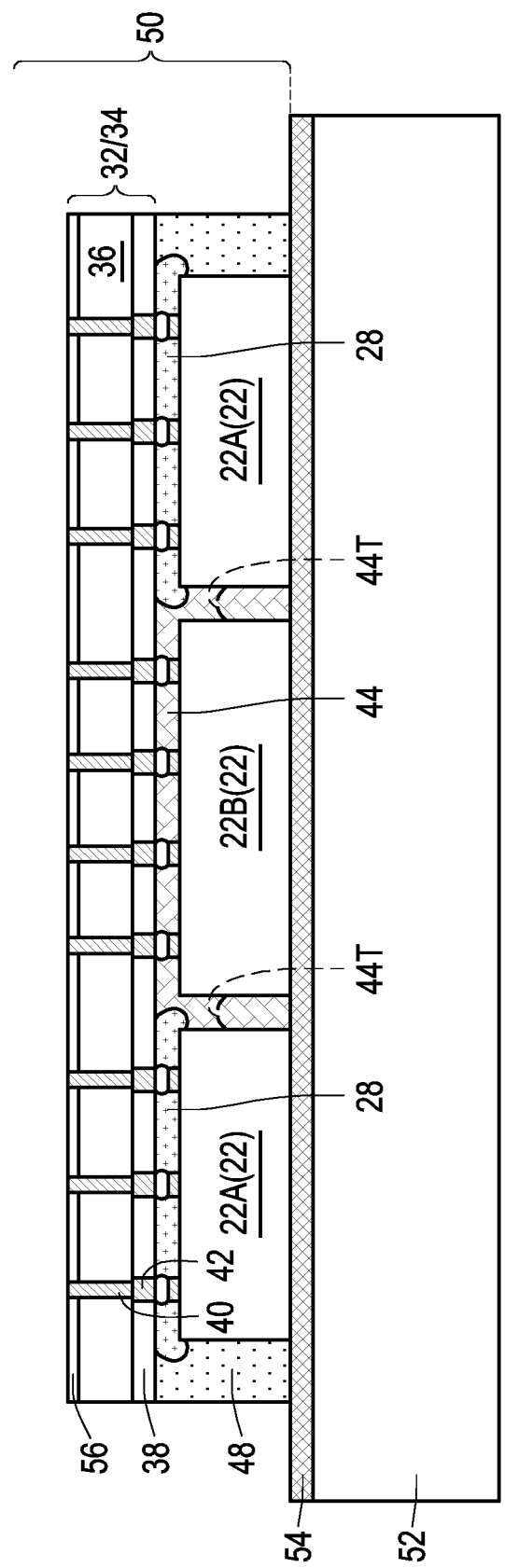
Figure 10:
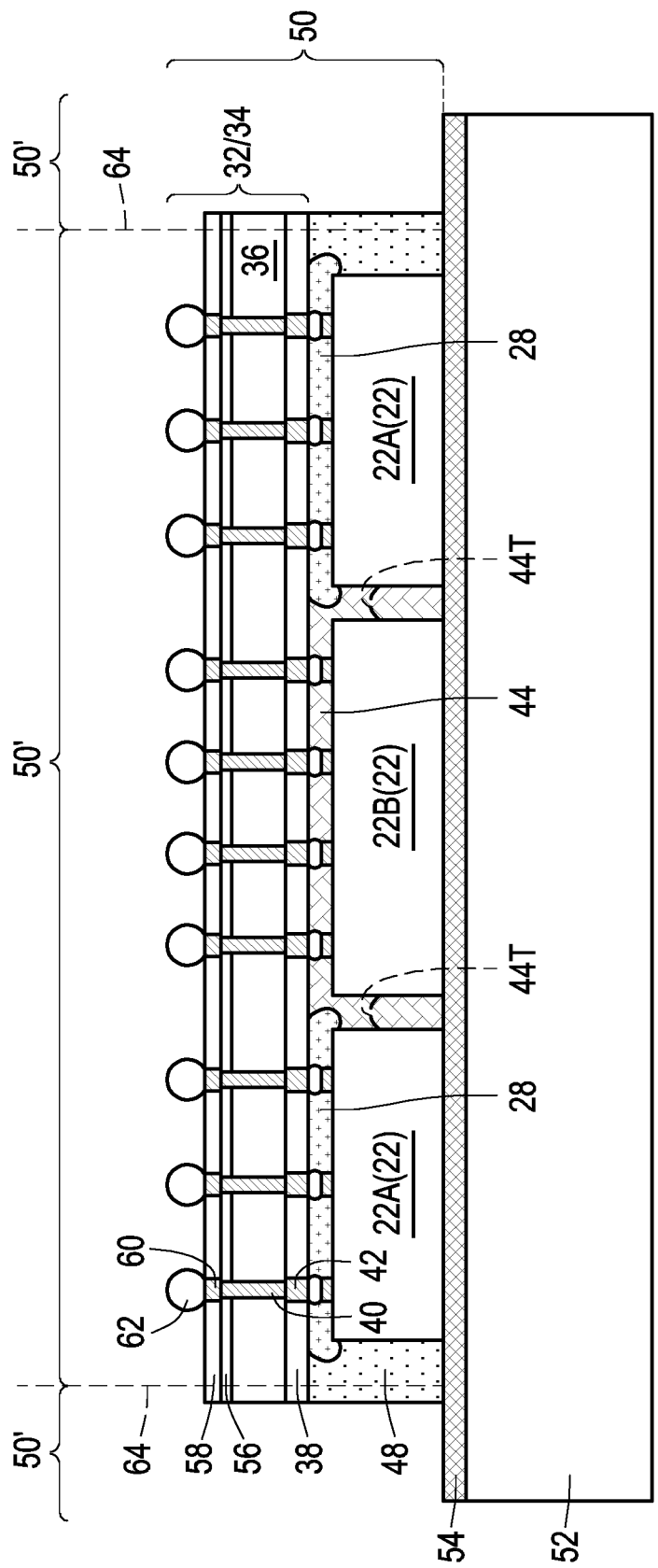

FIGS. 9 and 10 illustrate the formation of a backside interconnect structure. The respective process is illustrated as process 216 in the process flow 200 as shown in FIG. 31. Referring to FIG. 9, in accordance with some embodiments, a backside grinding process may be performed to thin substrate 36, until through-vias 40 are exposed. Next, substrate 36 may be recessed slightly through etching, so that through-vias 40 protrude out of the back surface of substrate 36. A dielectric material such as silicon oxide, silicon nitride, silicon oxynitride, or the like is then deposited on substrate 36, followed by a planarization process to level the top surface of the dielectric material and through-vias 40. The remaining dielectric material is shown as dielectric layer 56.

Next, referring to FIG. 10, dielectric layer(s) 58 and conductive features 60 (including RDLs and/or metal pads) are formed to electrically connect to through-vias 40. In accordance with some embodiments of the present disclosure, dielectric layers 58 are formed of oxides such as silicon oxide, nitrides such as silicon nitride, or the like. Conductive features 60 may be formed through plating, or alternatively, through damascene processes. Electrical connectors 62, which may include bond pads, metal pillars, solder regions, and/or the like, are formed over and electrically connected to conductive features 60.

Next, in accordance with some embodiments, reconstructed wafer 50 may be de-bonded from carrier 52. The respective process is illustrated as process 218 in the process flow 200 as shown in FIG. 31. In accordance with some embodiments, a light beam such as a laser beam is projected on release film 54, and release film 54 is de-composed under the heat of the light beam. Reconstructed wafer 50 is thus released from carrier 10. In a subsequent process, reconstructed wafer 50 may be placed on a dicing tape (not shown), and is singulated through a sawing process along scribe lines 64, so that reconstructed wafer 50 is separated into discrete packages 50'. The respective process is illustrated as process 220 in the process flow 200 as shown in FIG. 31.

Figure 11:
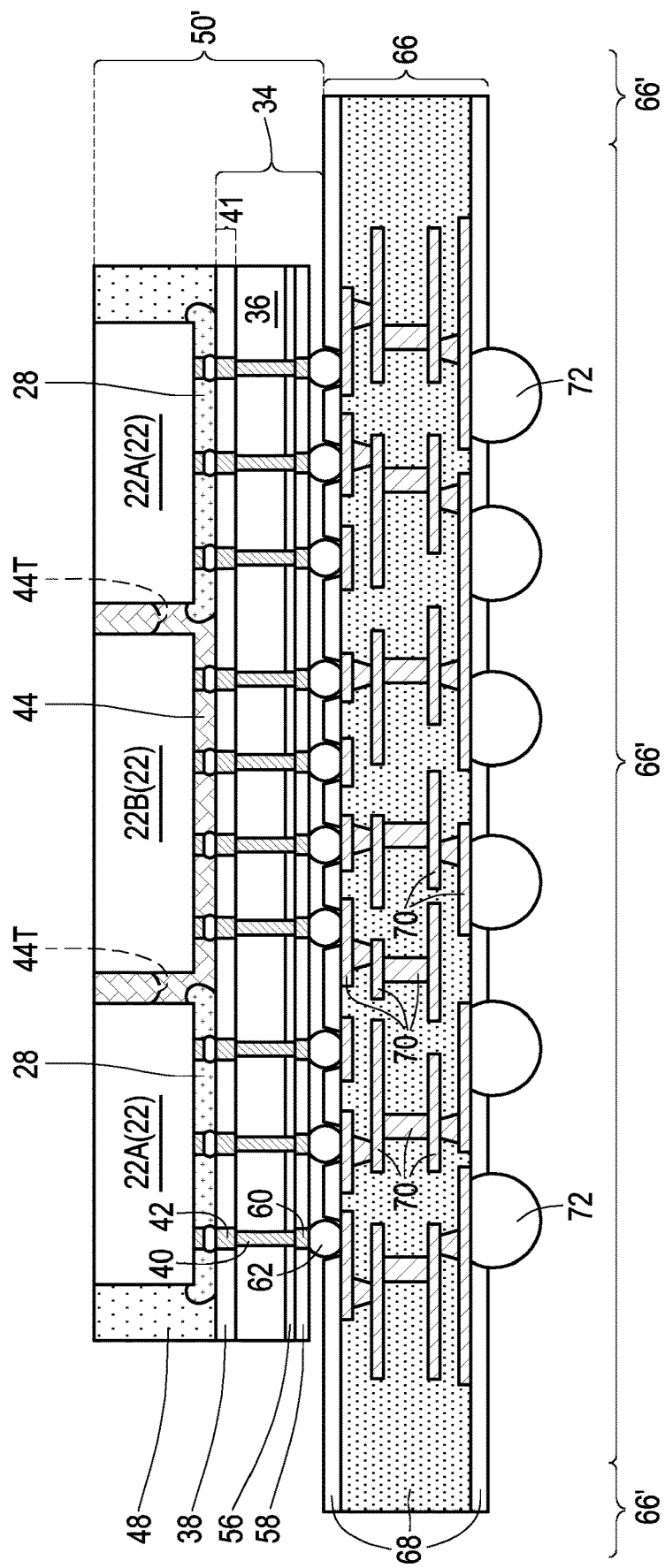

FIG. 11 illustrates the bonding of package 50' onto another package component 66. The respective process is illustrated as process 222 in the process flow 200 as shown in FIG. 31. In accordance with some embodiments, package component 66 is a wafer-level component, which includes a plurality of identical package components 66' therein. For example, package component 66 may be a package substrate strip, which includes a plurality of package substrates 66' therein. Package substrates 66' may be cored package substrates including cores, or may be core-less package substrates that do not have cores therein. In accordance with alternative embodiments, package component 66 may be of another type such as an interposer wafer, a reconstructed wafer, or the like. Package component 66 may be free from active devices such as transistors and diodes therein. Package component 66 may also be free from (or may include) passive devices such as capacitors, inductors, resistors, or the like therein.

Package component 66 includes a plurality of dielectric layers 68. In accordance with some embodiments, dielectric layers 68 may comprise dry films such as Ajinomoto Build-up Films (ABFs), polybenzoxazole (PBO), polyimide, or the like. When dielectric layers 68 comprise cores, the dielectric materials may include epoxy, resin, glass fiber, prepreg, glass, molding compound, plastic, combinations thereof, and/or multi-layers thereof. Redistribution lines 70, which may include metal lines/pads and vias, metal pipes, and the like, are formed in dielectric layers 68. Redistribution lines 70 are interconnected to form through-connections in package component 66. Package component 66 may also include electrical connectors such as solder regions 72 at its bottom.

Figure 12:
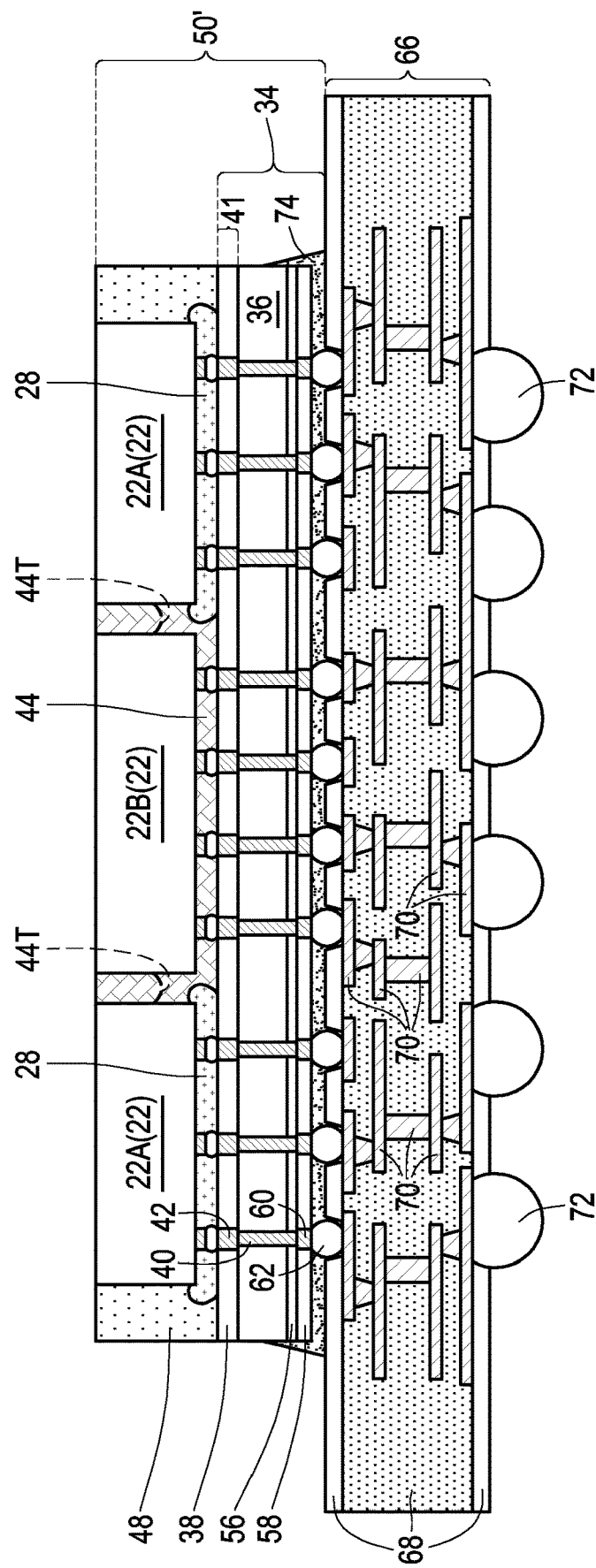

FIG. 12 illustrates the dispensing of underfill 74. The respective process is illustrated as process 224 in the process flow 200 as shown in FIG. 31. Underfill 74 is then cured. In accordance with some embodiments, underfill 74 is formed of a same underfill as, or a different underfill from, capillary underfill 44.

Figure 13A:
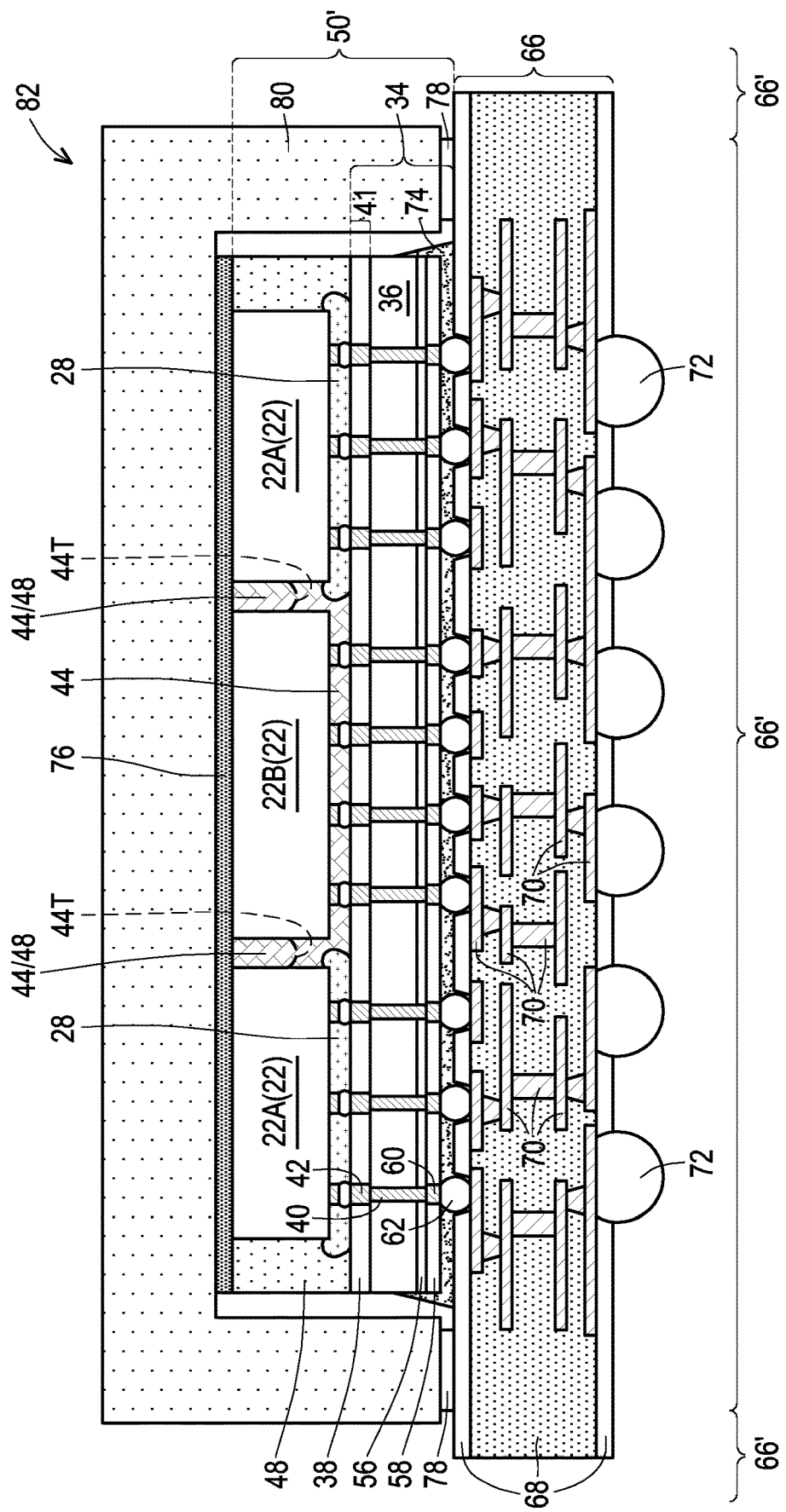

FIG. 13A illustrates the attachment of thermal interface material 76 onto the top surface of package 50'. The respective process is illustrated as process 226 in the process flow 200 as shown in FIG. 31. Thermal interface material 76 may be dispensed onto package 50' as a flowable material, or as a pre-formed film that is laminated on package 50'. Adhesive ring 78 may be dispensed on package component 66'. Heat sink 80 (which may also be metal lid) may then be placed, and is attached to thermal interface material 76, and possibly adhesive ring 78. The respective process is illustrated as process 228 in the process flow 200 as shown in FIG. 31. Package components 66' may be singulated from the respective package component 66, so that a plurality of packages 82 are formed, each including package component 66', package 50' bonded thereon, and heat sink 80.

Figure 14:
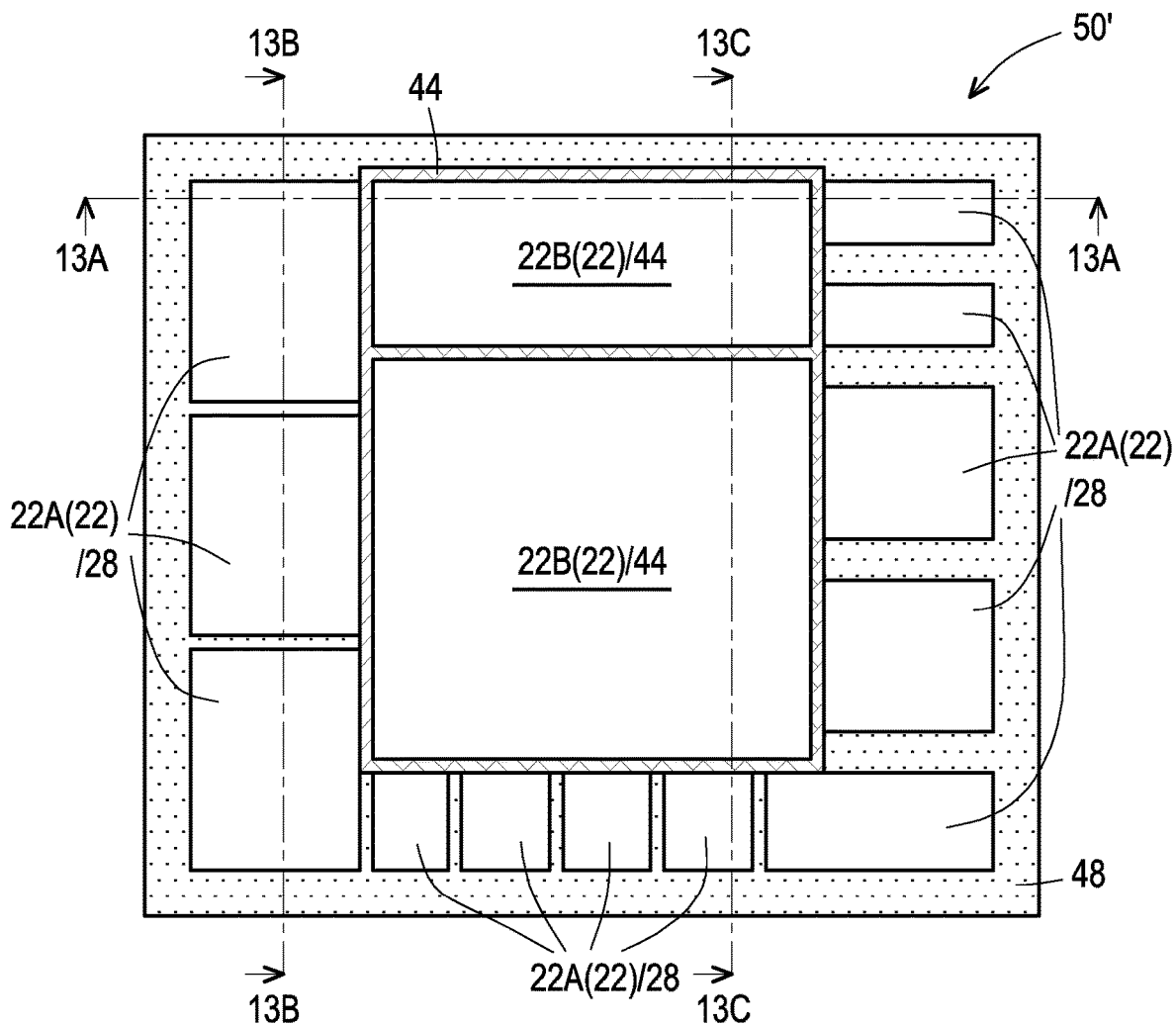
FIGS. 14-17 illustrate the top views of packages including multiple types of underfills in accordance with some embodiments.

FIG. 14 illustrates a top view of package 50' in accordance with some embodiments, wherein the reference cross-section 13A-13A in FIG. 14 is shown in FIG. 13A. Package components 22A may have NCFs 28 underneath. Package components 22B may be large package components such as SOC dies. Accordingly, capillary underfill 44 is dispensed from one side of one of the package components 22B, and flows under both of package components 22B. Capillary underfill 44 may climb up the gaps between package components 22B and their neighboring package components 22A. Encapsulant 48 surrounds package components 22A and 22B, and may further fill the wide gaps between neighboring package components 22A and 22B.

Figure 13B:
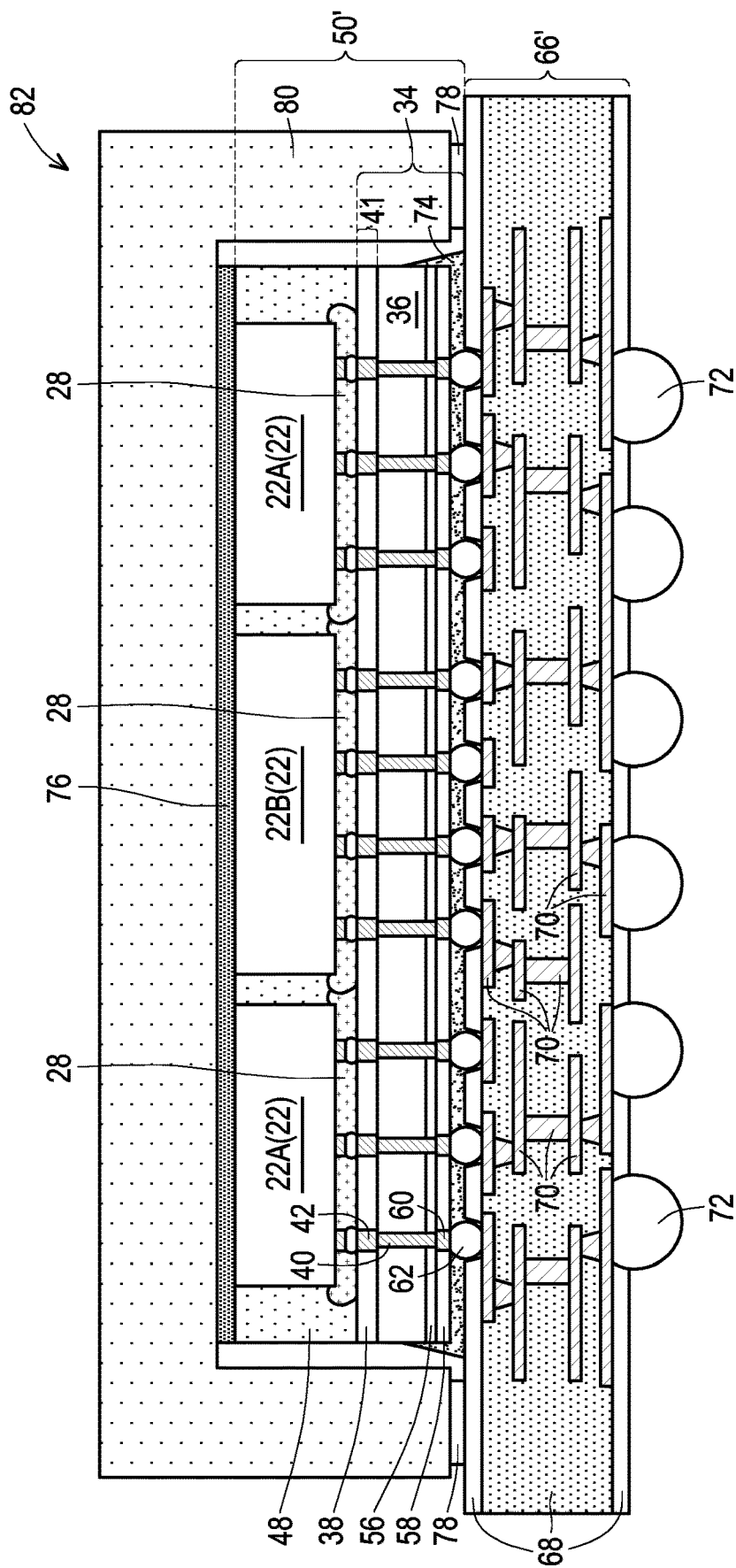
Figure 13C:
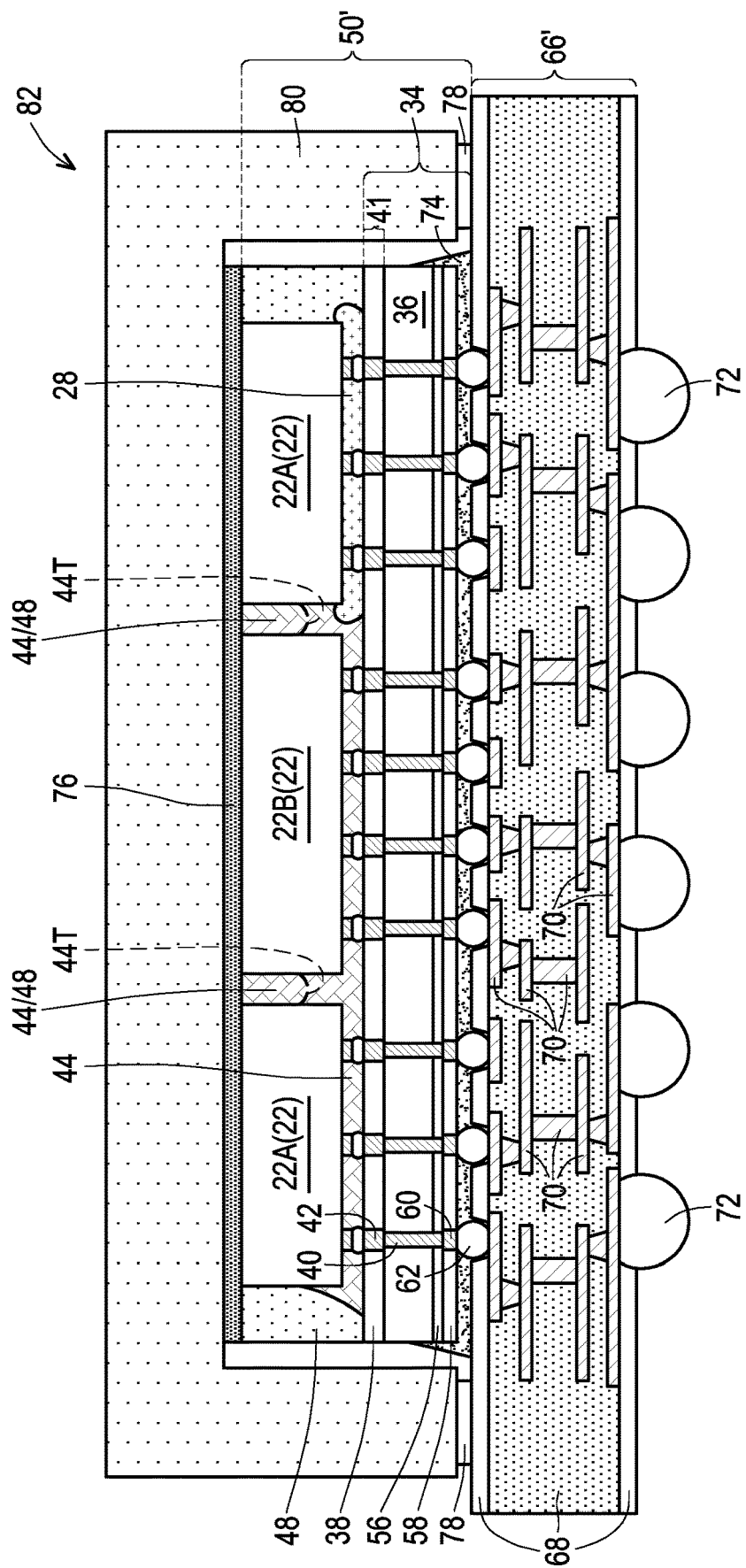

FIG. 13B illustrates the reference cross-section 13B-13B in FIG. 14 in accordance with some embodiments. As shown in FIG. 13B, each of the package components 22A as illustrated has an NCF 28 underneath. The NCFs 28 underlying neighboring package components 22A may be in contact each other or spaced apart from each other. FIG. 13C illustrates the reference cross-section 13C-13C in FIG. 14 in accordance with some embodiments. As shown in FIGS. 13A and 13C, dashed lines 44T represent the top surface of capillary underfill 44 in accordance with some embodiments, with encapsulant 48 being higher than top surfaces 44T, and in contact with capillary underfill 44. In accordance with alternative embodiments, capillary underfill 44 extends to the same level as the top surfaces of package components 22A and 22B, and dashed lines 44T do not exist.

Figure 15:
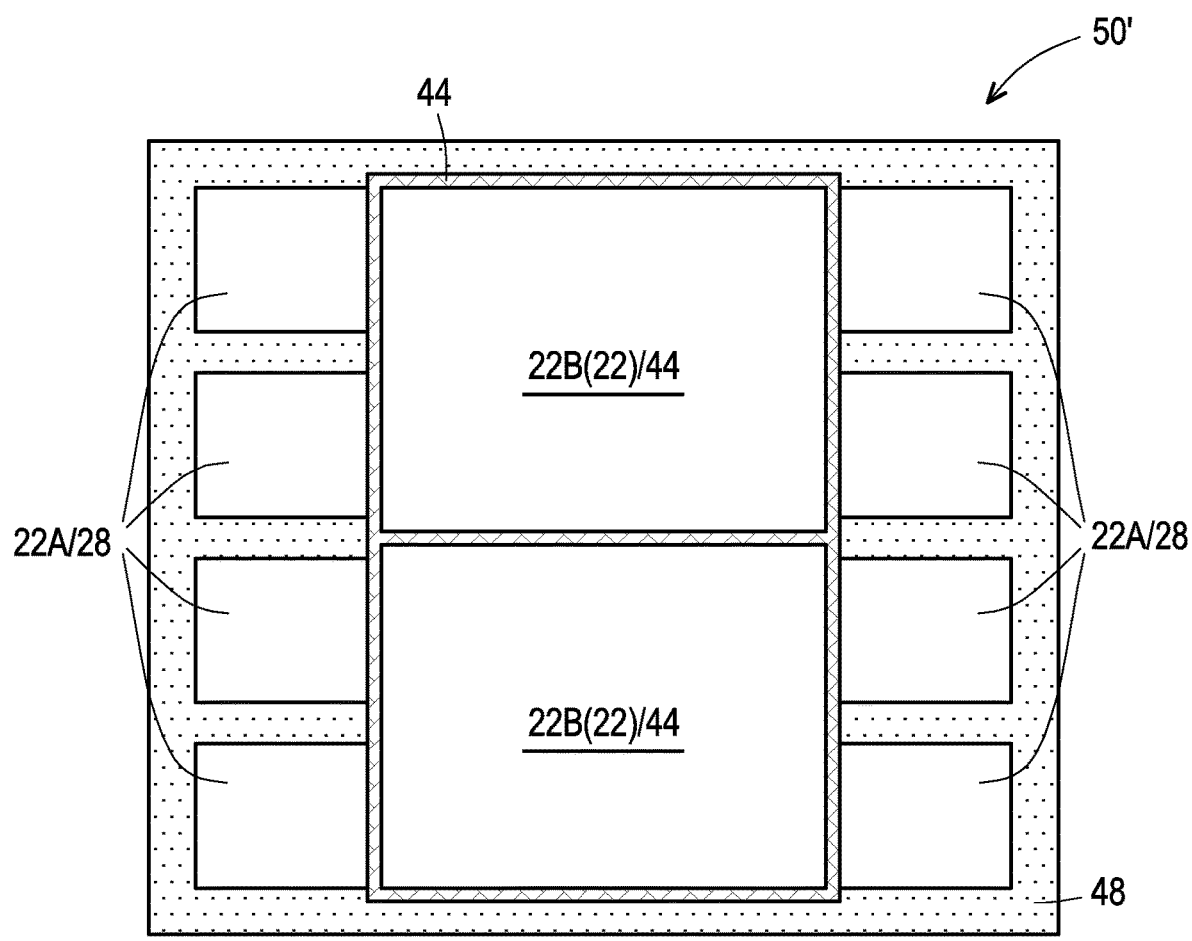

FIG. 15 illustrates the top view of package 50' in accordance with alternative embodiments of the present disclosure. This embodiment is similar to the embodiment as shown in FIG. 14, except that the two package components 22B in combination occupy a middle region of package 50', and extend close to the opposing edges of package 50'. Capillary underfill 44 is dispensed underlying and surrounding package components 22B. Two columns of package components 22A may be placed on the opposite sides of package components 22B, with NCFs 28 being underneath package components 22A.

Figure 16:
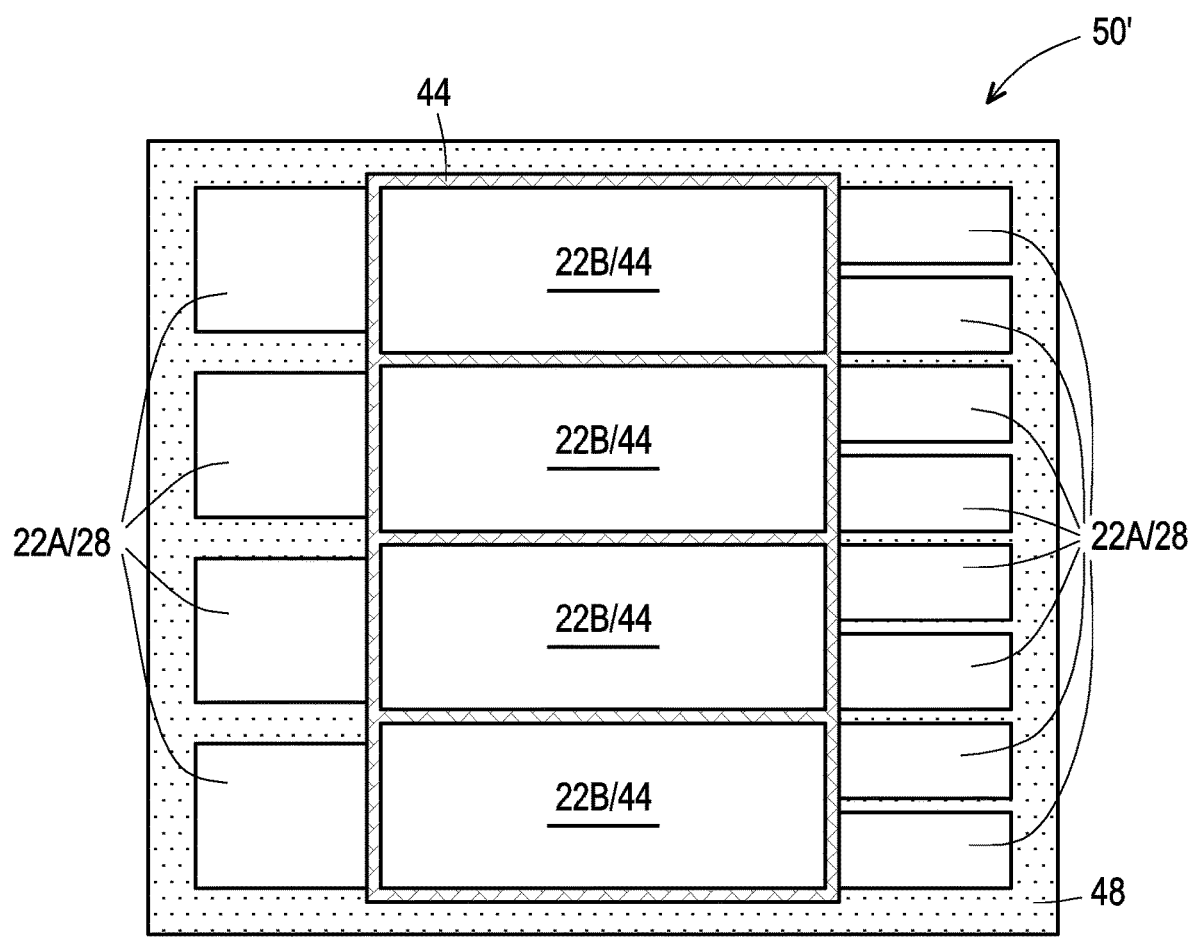

FIG. 16 illustrates the top view of package 50' in accordance with alternative embodiments of the present disclosure. This embodiment is similar to the embodiment as shown in FIG. 15, except that four package components 22B in combination occupy a middle region of package 50', and extend close to the opposing edges of package 50'. Capillary underfill 44 is dispensed underlying and surrounding package components 22B. Two columns of package components 22A are on the opposite sides of package components 22B, with NCFs 28 underneath package components 22A. The package components 22A on the right side of package components 22B are smaller than the package components 22A on the left side of package components 22B.

Figure 17:
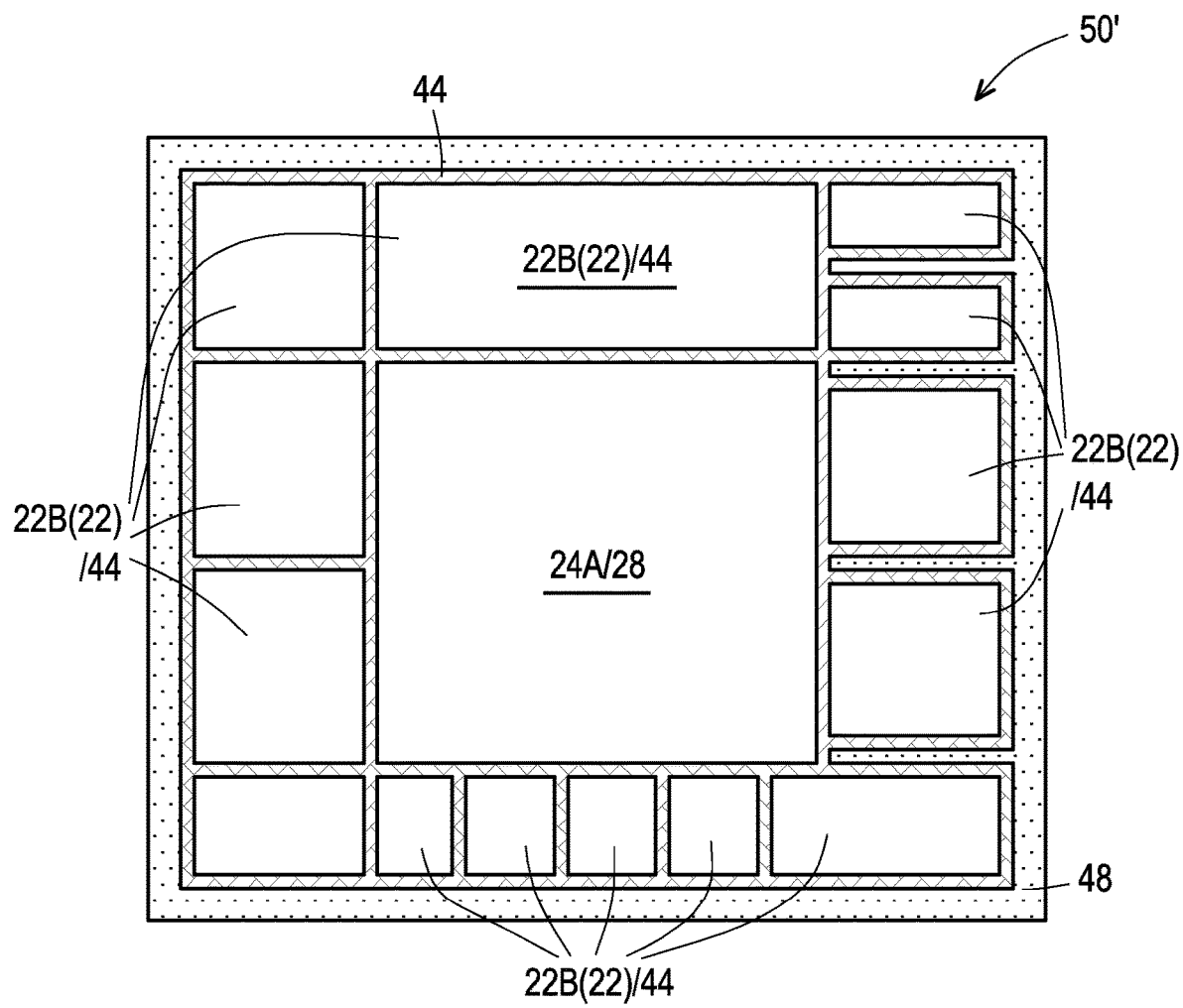

FIG. 17 illustrates the top view of package 50' in accordance with alternative embodiments of the present disclosure. This embodiment is similar to the embodiment as shown in FIG. 14, except that a large package component 22A is in the middle, with NCF 28 underlying package component 22A. Package components 22B are allocated surrounding package component 22A. Capillary underfill 44 is dispensed underlying and surrounding each of package components 22B.

FIGS. 18-23 and 24A illustrate cross-sectional views of intermediate stages in the formation of a package in accordance with some embodiments of the present disclosure. These embodiments are similar to the preceding embodiments, except that instead of using the combination of NCF and capillary underfill, a combination of capillary underfill and molding underfill are used, while NCF is not used. Unless specified otherwise, the materials and the formation processes of the components in these embodiments are essentially the same as the like components, which are denoted by like reference numerals in the preceding embodiments shown in FIGS. 1-12, 13A, 13B, and 13C. The details regarding the formation process and the materials of the components shown in FIGS. 18-23 and 24A may thus be found in the discussion of the preceding embodiments.

Figure 18:
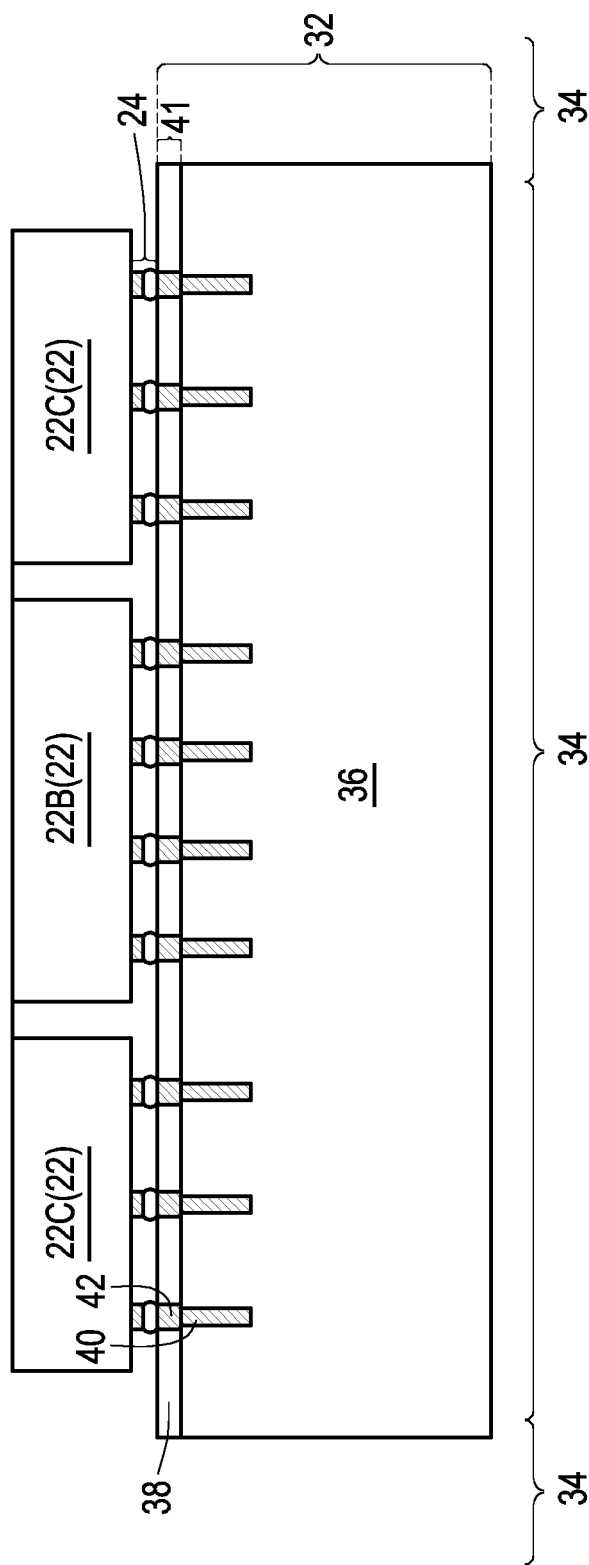
FIGS. 18-23, 24A, 24B, and 24C illustrate the cross-sectional views of intermediate stages in the formation of a package including multiple types of underfills in accordance with some embodiments.

FIG. 18 illustrates the bonding of package components 22B and 22C (which are collectively referred to as package components 22) over package component 32. Each of package components 22B and 22C may be a device die, a package, an IPD, or the like. Package component 32 may be an interposer wafer, while it may also be of another type.

Figure 19:
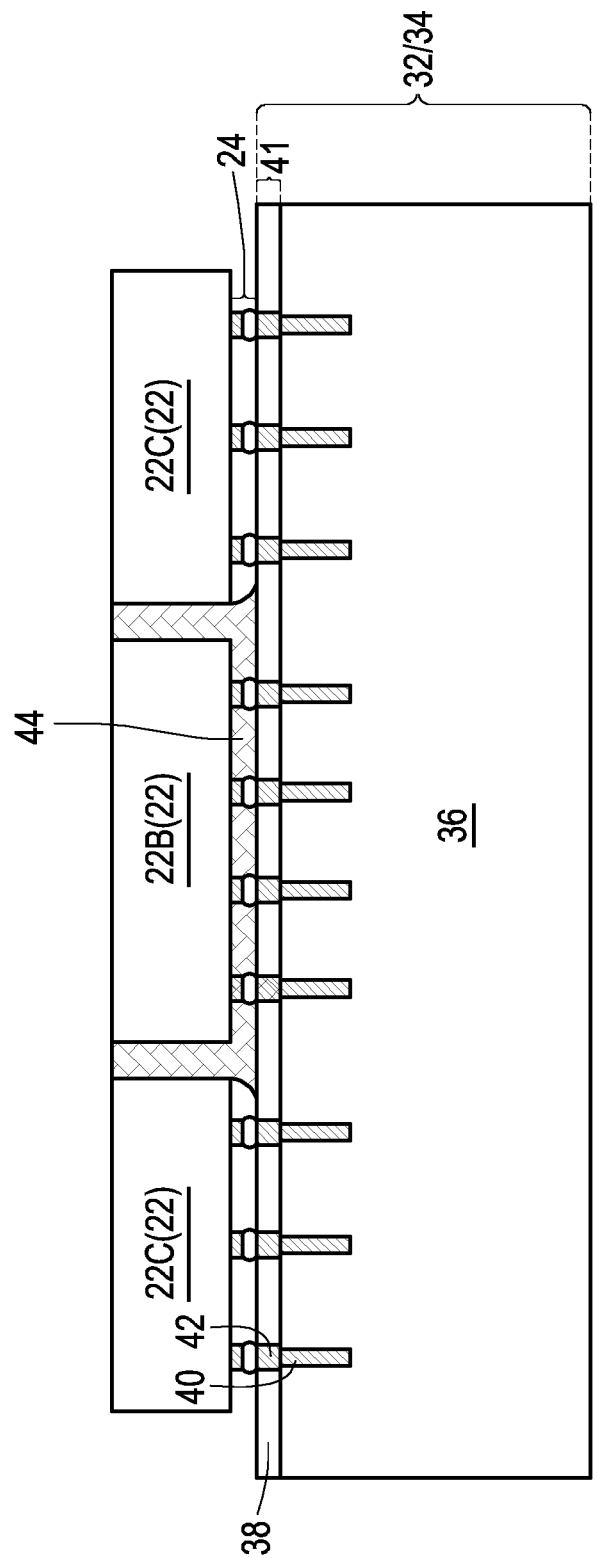

Referring to FIG. 19, capillary underfill 44 is dispensed. In accordance with some embodiments, the gaps between package component 22B and its neighboring package components 22C is large, and/or the gaps between package components 22C and the respective underlying portions of package component 32 is large, and hence capillary underfill 44 is limited around package component 22B, and will not flow underlying package components 22C. In accordance with alternative embodiments, package components 22B are bonded to package component 32 first, and capillary underfill 44 is dispensed, followed by the bonding of package components 22C to package component 32.

Figure 20:
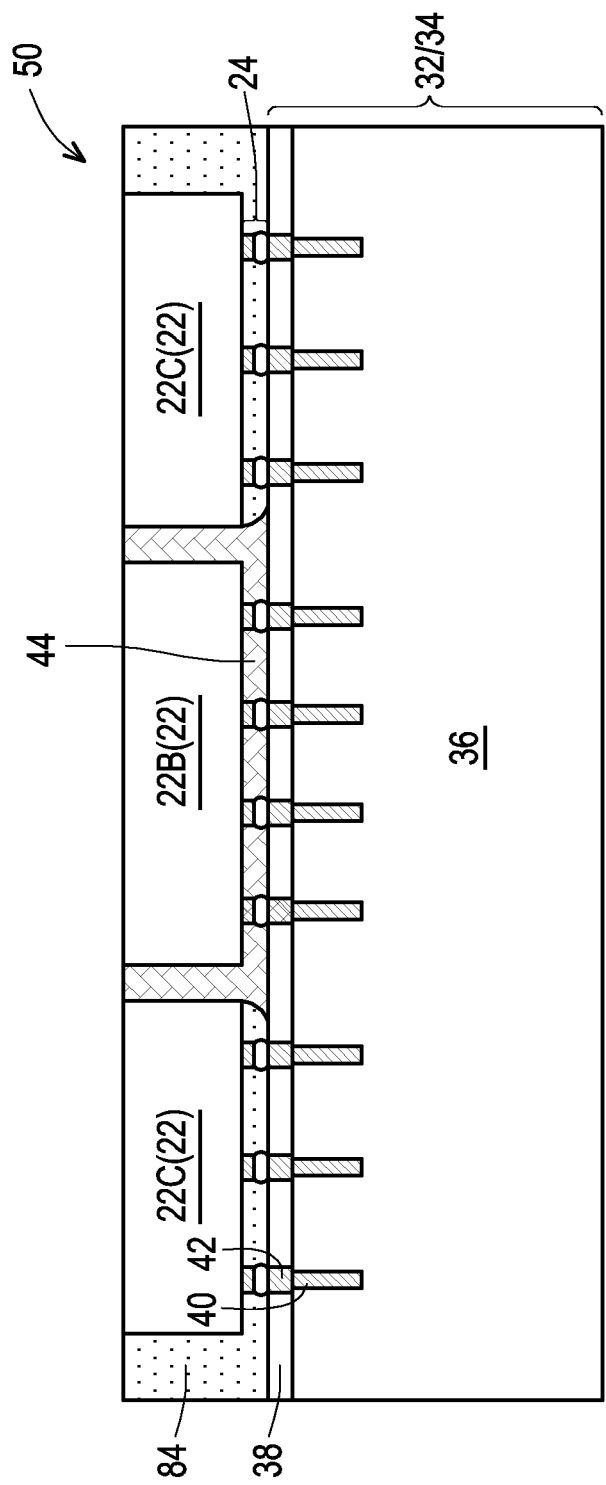

FIG. 20 illustrates the dispensing of molding underfill 84, which flows to the gaps between package components 22C and the respective underlying portions of package component 32. Molding underfill 84 also surrounds package components 22B and 22C, and is dispensed to a level higher than the top surfaces of package components 22B and 22C. In accordance with some embodiments, capillary underfill 44 is cured before molding underfill 84 is dispensed. In accordance with alternative embodiments, capillary underfill 44 and molding underfill 84 are cured in a same curing process. After the curing of molding underfill 84, a planarization process such as a CMP process or a mechanical polishing process is performed to remove excess portions of molding underfill 84. The substrates (such as the semiconductor substrates) of package components 22B and 22C may thus be exposed. Reconstructed wafer 50 is thus formed.

Figure 21:
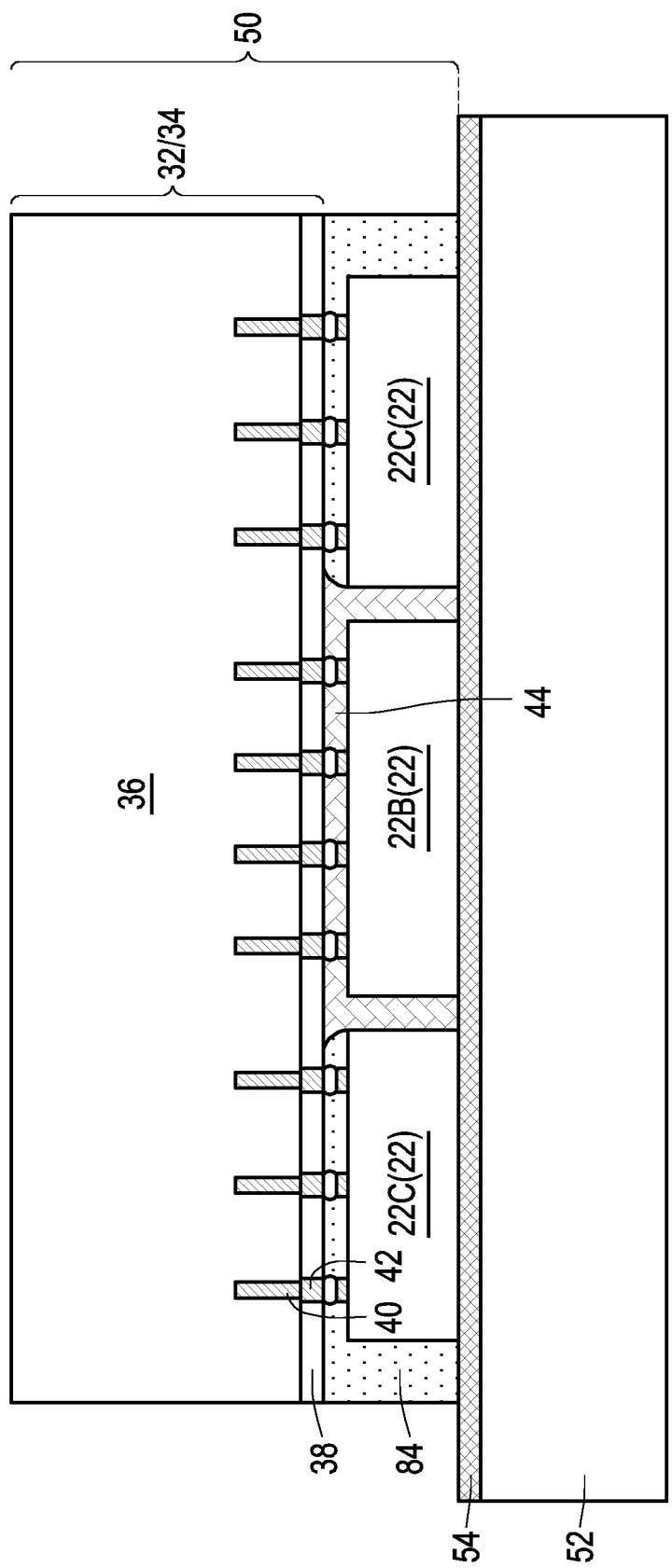
Figure 22:
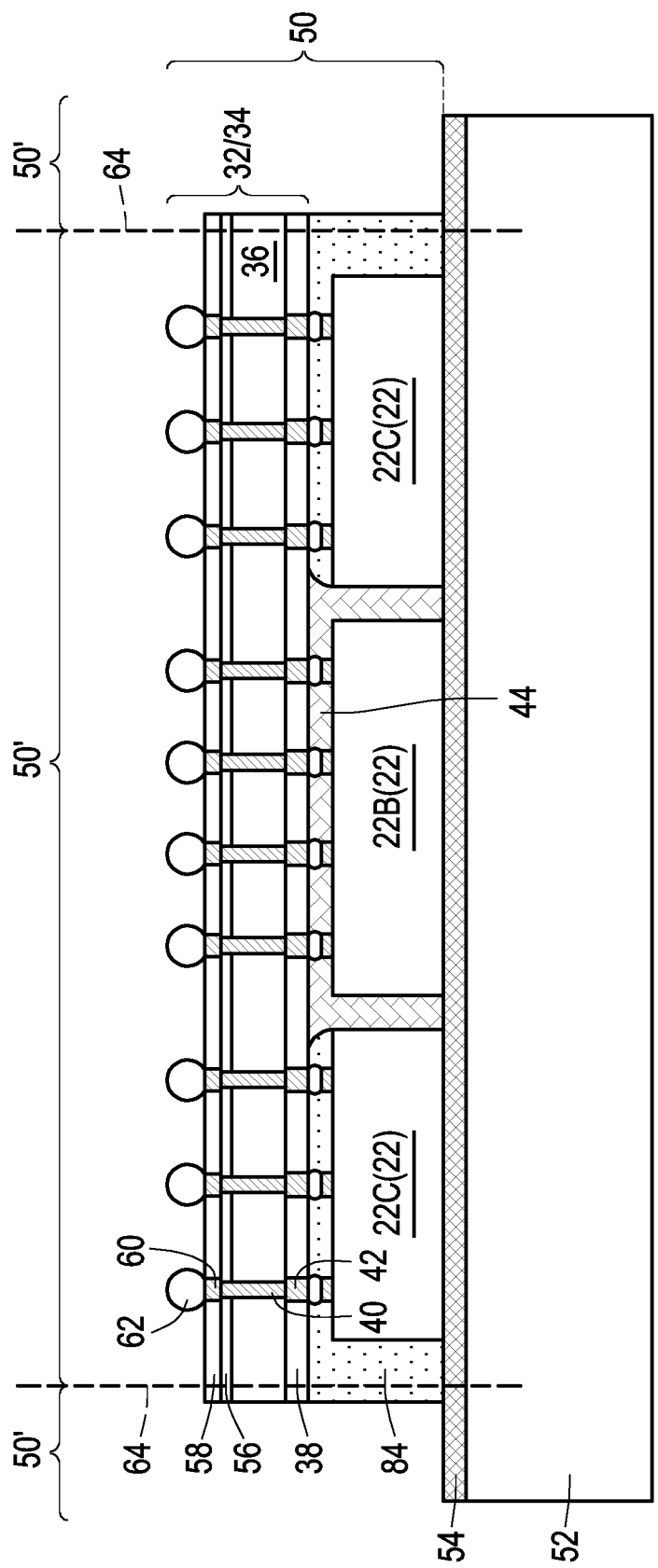

Referring to FIG. 21, reconstructed wafer 50 is placed over carrier 52 through release film 54. In accordance with some embodiments, a backside grinding process may be performed to thin substrate 36, until through-vias 40 are exposed. Dielectric layer 56 is then formed, as shown in FIG. 22. Dielectric layer(s) 58 are then formed, and conductive features 60 (including RDLs and/or metal pads) are formed in dielectric layers 58 to electrically connect to through-vias 40. Electrical connectors 62, which may include bond pads, metal pillars, solder regions, and/or the like, are formed. The details for forming these features have been discussed in preceding embodiments, and are not repeated herein.

Next, reconstructed wafer 50 may be de-bonded from carrier 52. In a subsequent process, reconstructed wafer 50 may be placed on a dicing tape (not shown), and is singulated through a sawing process along scribe lines 64, so that reconstructed wafer 50 is separated into discrete packages 50'.

Figure 23:
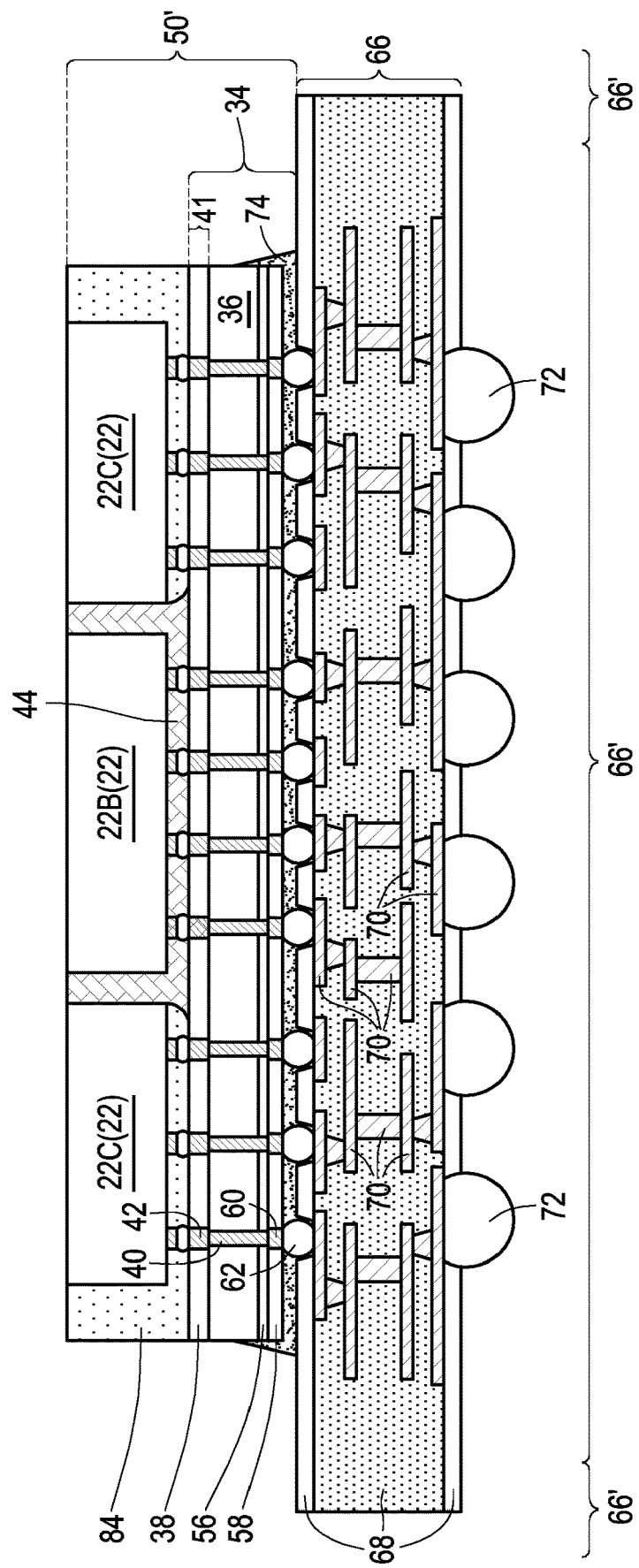
Figure 24A:
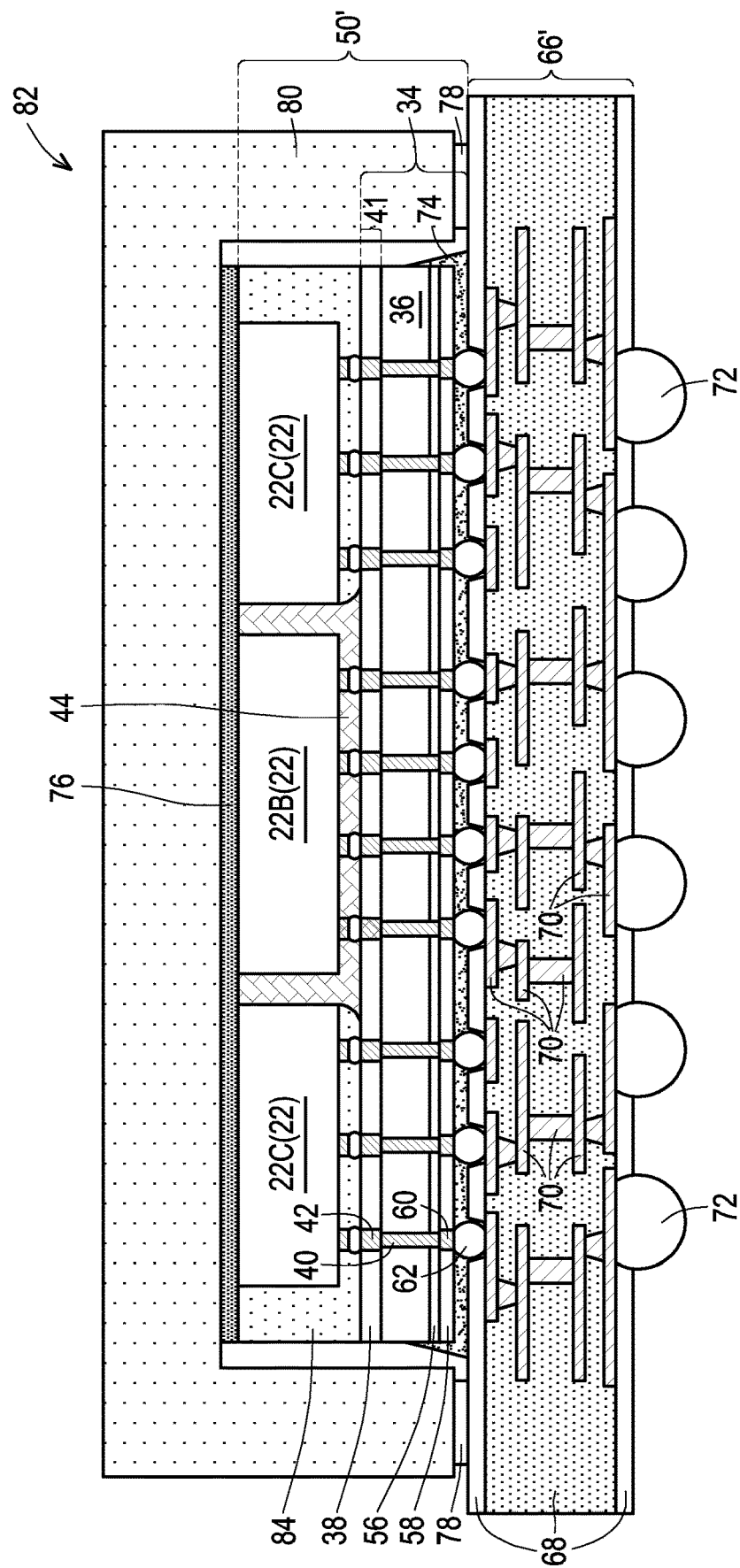

FIG. 23 illustrates the bonding of package 50' onto another package component 66, which may include package components 66'. Next, as shown in FIG. 24A, thermal interface material 76 is formed over package 50'. Adhesive ring 78 is also dispensed, and heat ring (or metal lid) 80 may be attached to thermal interface material 76 and adhesive ring 78.

Figure 24B:
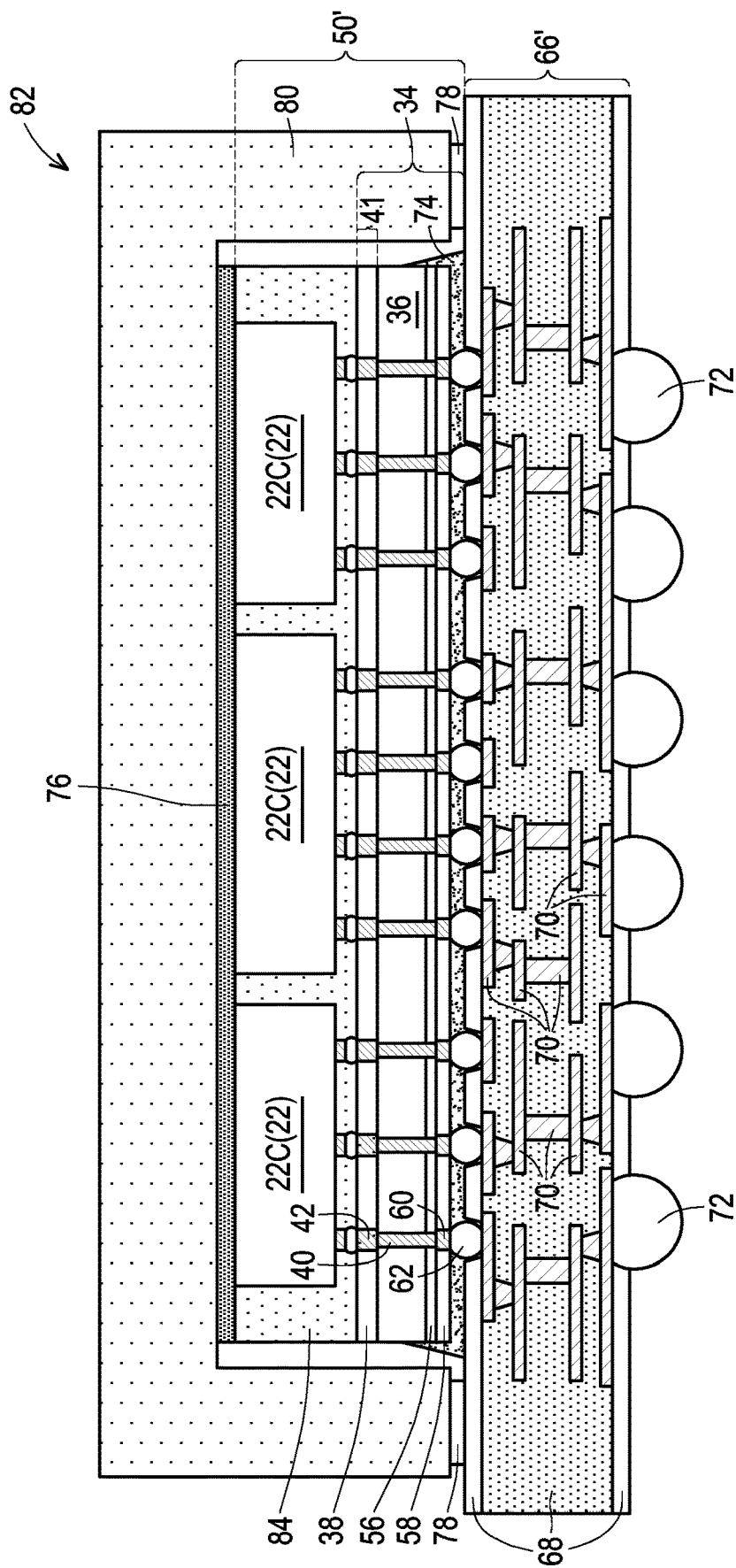
Figure 24C:
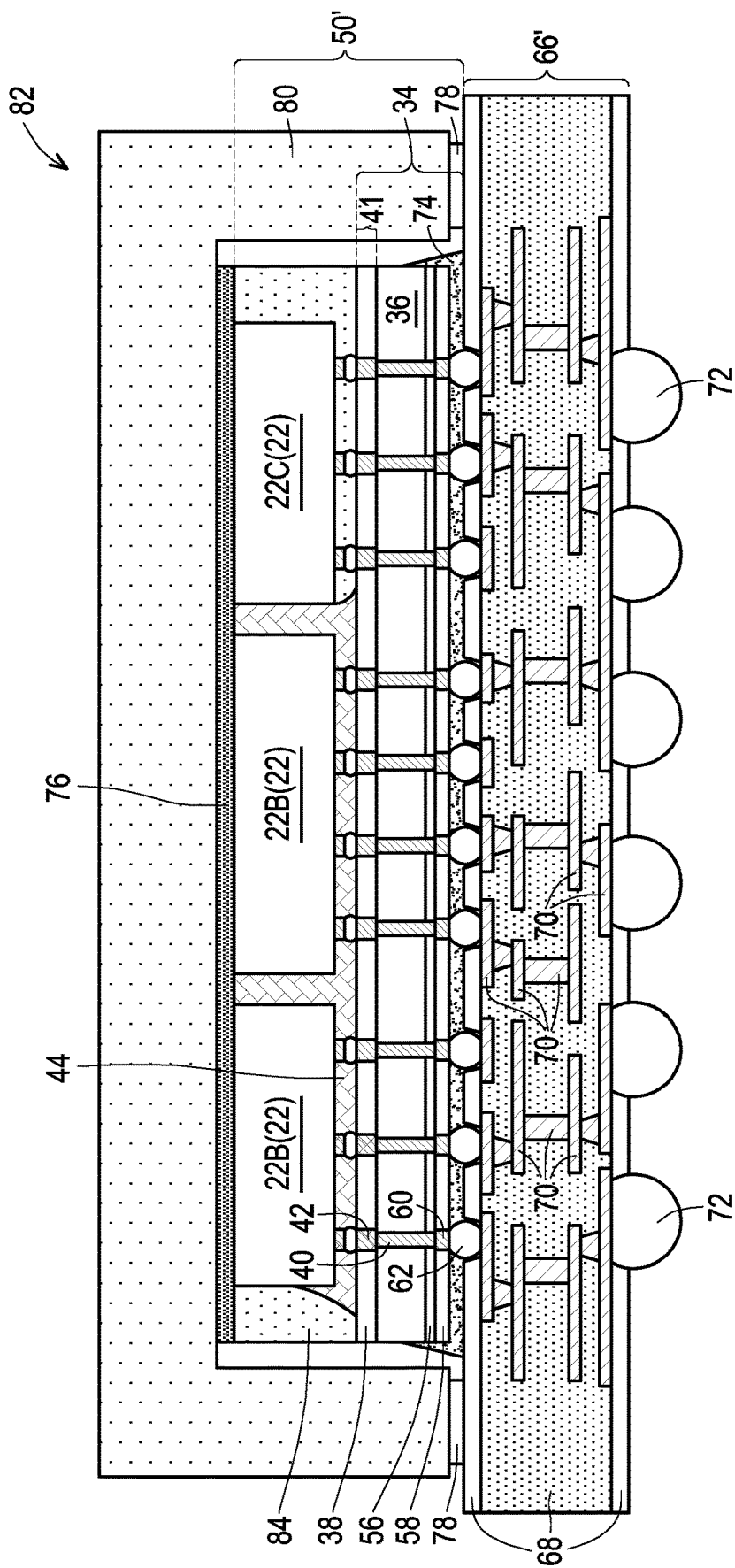
Figure 25:
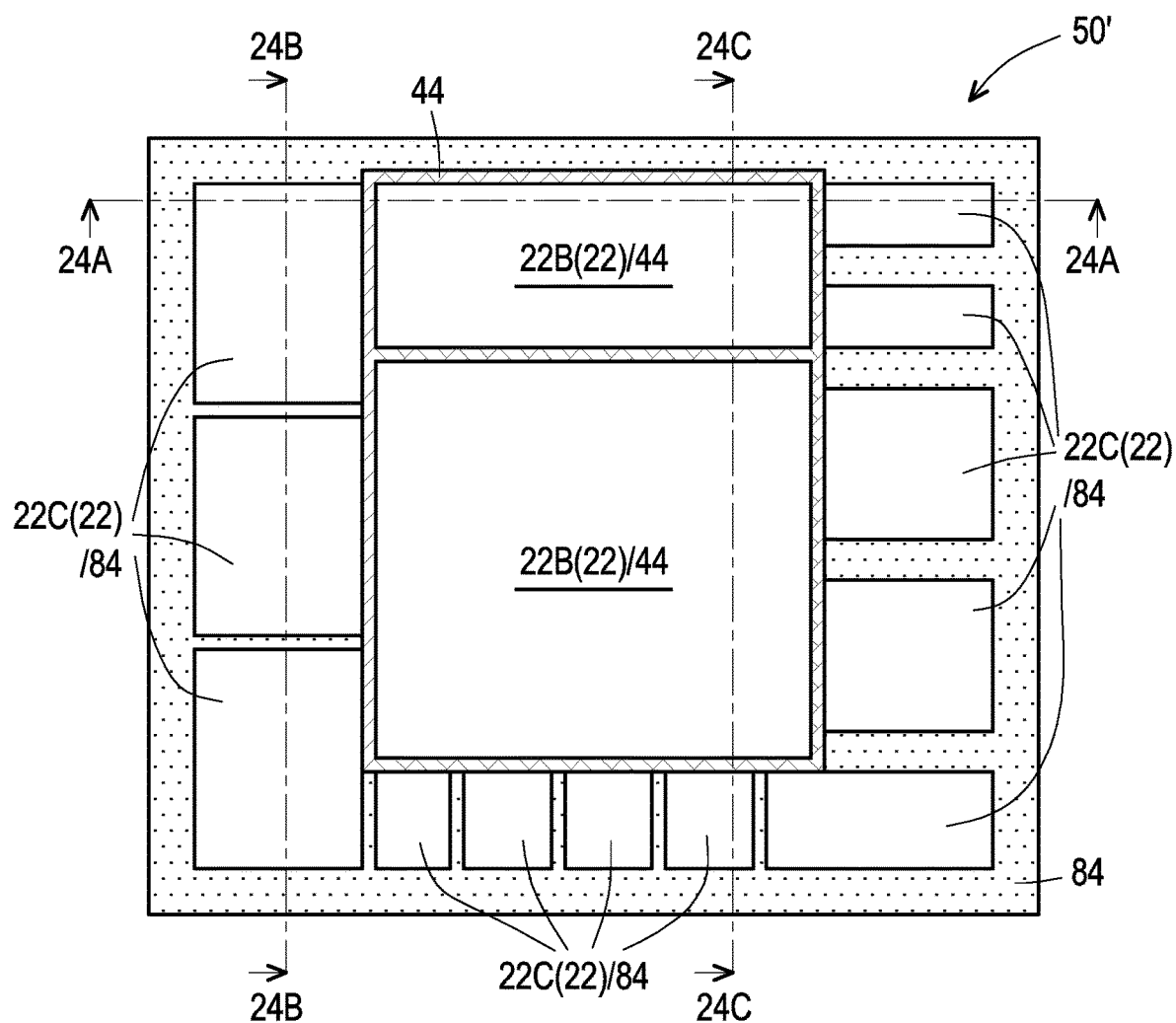
FIGS. 25-28 illustrate the top views of packages including multiple types of underfills in accordance with some embodiments.

FIG. 25 illustrates a top view of package 50' in accordance with some embodiments. The reference cross-sections 24A-24A, 24B-24B, and 24C-24C are shown in FIGS. 24A, 24B, and 24C, respectively. In accordance with some embodiments, as shown in FIG. 25, two package components 22B are placed next to each other, with capillary underfill 44 being dispensed underlying and surrounding package components 22B. Package components 22C may be placed around package components 22B. In accordance with some embodiments, package components 22B are large in area, and it is difficult for molding underfill to flow throughout the gaps between package components 22B and the underlying package component 34. Accordingly, capillary underfill 44, which has lower viscosity than the molding underfill 84, is used.

Figure 26:
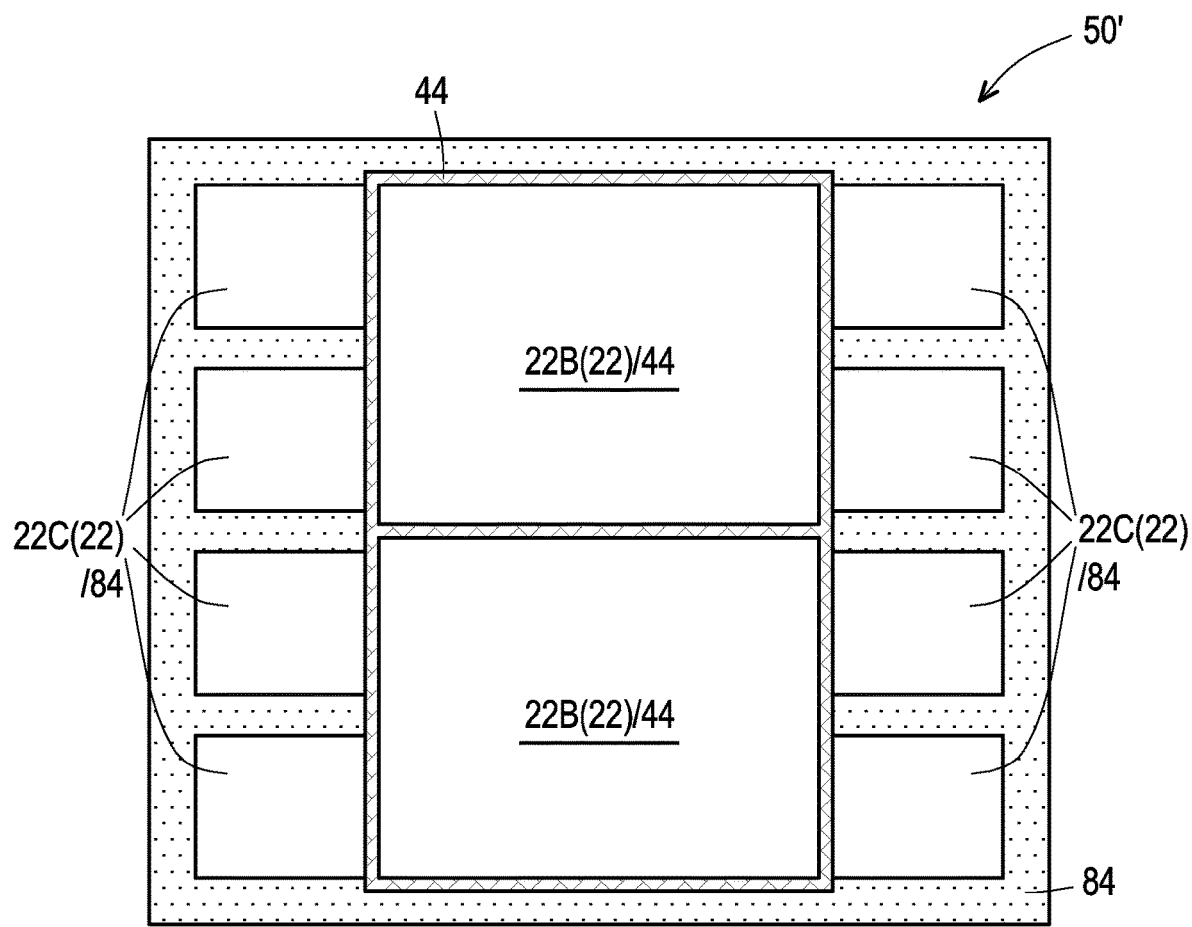

FIG. 26 illustrates the top view of package 50' in accordance with alternative embodiments of the present disclosure. This embodiment is similar to the embodiment as shown in FIG. 25, except the two package components 22B in combination extend close to the opposing edges of package 50'. Capillary underfill 44 is dispensed underlying and surrounding package components 22B. Two columns of package components 22C are placed on opposite sides of package components 22B, with molding underfill 84 extending underneath package components 22C, and surrounding package components 22B and 22C.

Figure 27:
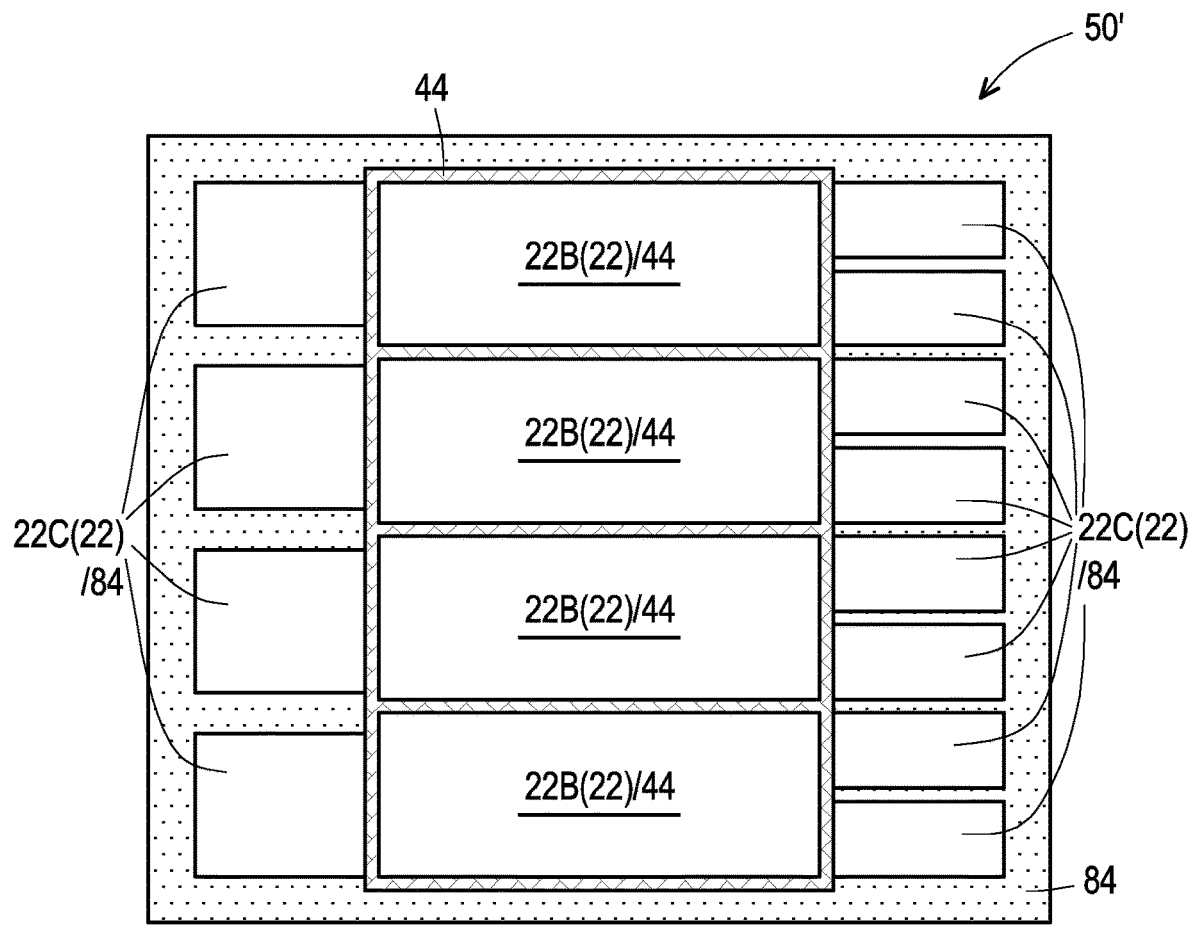

FIG. 27 illustrates the top view of package 50' in accordance with alternative embodiments of the present disclosure. This embodiment is similar to the embodiment as shown in FIG. 26, except there are four package components 22B, and the numbers of package components 22C on the left and right sides of package components 22B are different from each other. Capillary underfill 44 is dispensed underlying and surrounding package components 22B. Molding underfill 84 extends underneath package components 22C, and may extend to multiple sides of each of package components 22C. The right-side column has more, and smaller, package components 22C than the left-side column.

Figure 28:
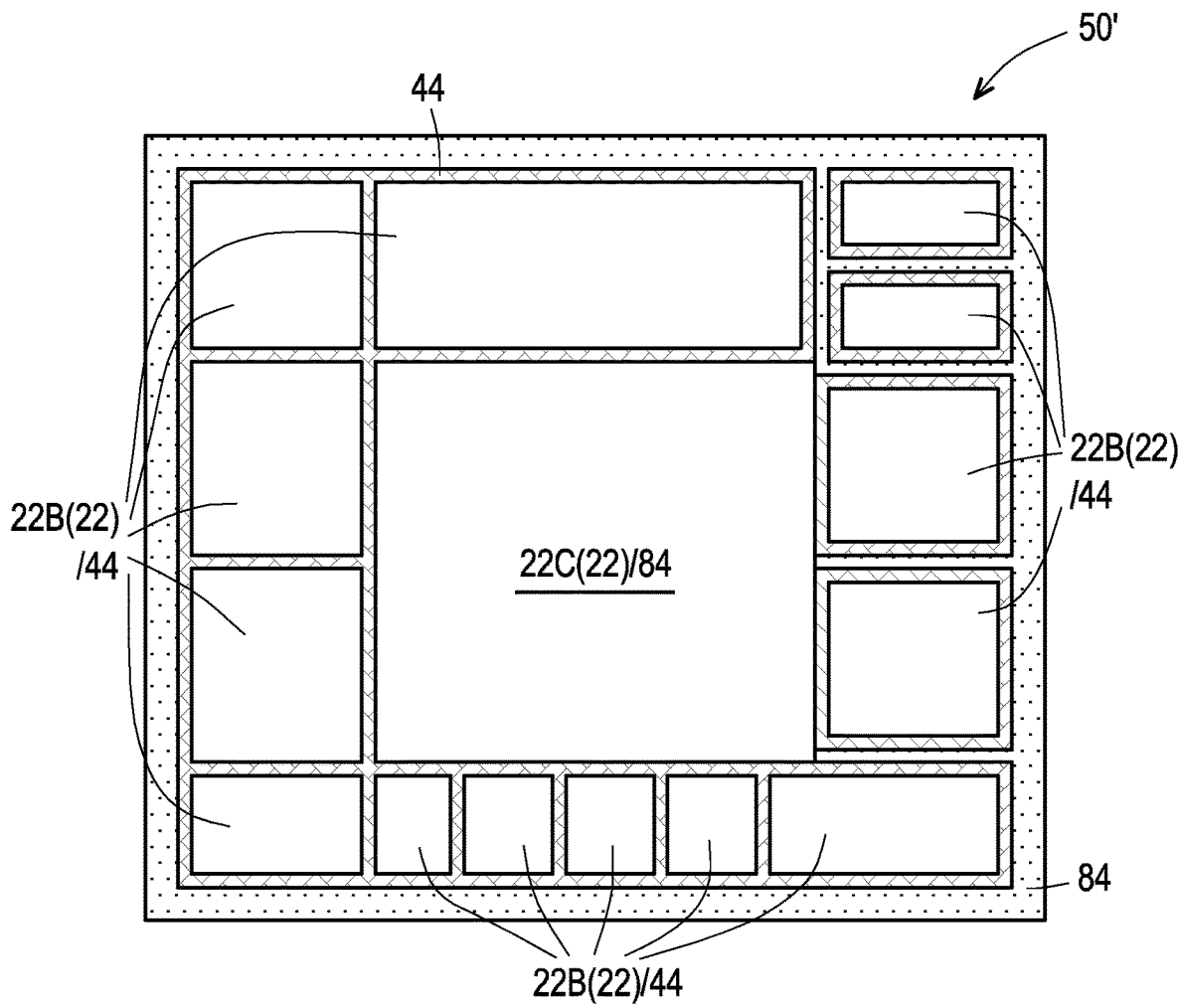

FIG. 28 illustrates the top view of package 50' in accordance with alternative embodiments of the present disclosure. This embodiment is similar to the embodiment as shown in FIG. 14, except a large package component 22C is in the middle of package 50', with molding underfill 84 extending underlying package component 22C. Package components 22B are allocated surrounding package component 22C. Capillary underfill 44 surrounds, and extends underlying, package components 22B. Molding underfill 84 is also dispensed surrounding package components 22C and 22B.

Figure 29:
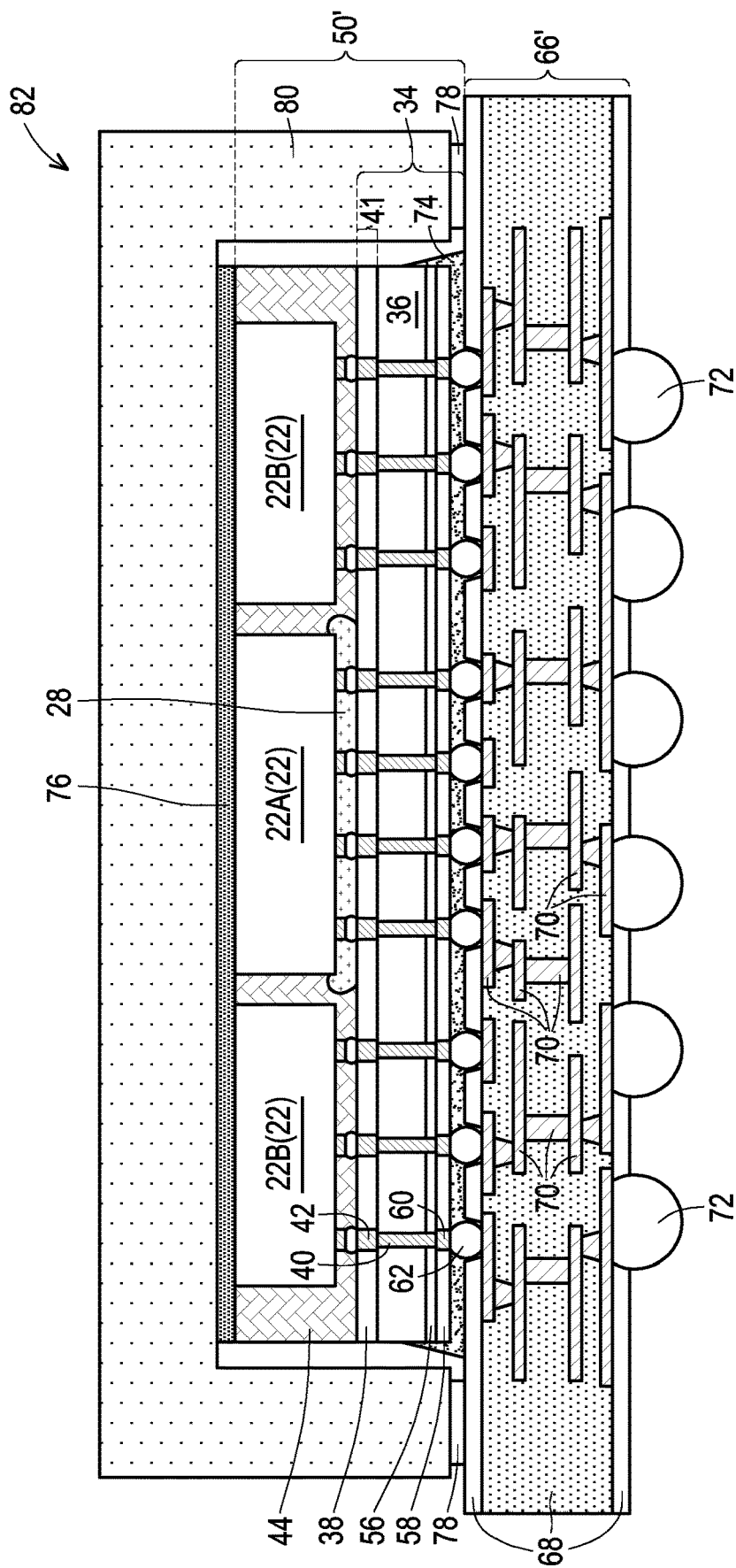
FIG. 29 illustrates a cross-sectional view of a package including multiple types of underfills in accordance with some embodiments.

FIG. 29 illustrates a cross-sectional view of package 82 in accordance with some embodiments. In these embodiments, NCF 28 is underlying package component 22A, and capillary underfill 44 extends underlying package components 22B. Capillary underfill 44 also surrounds package components 22A and 22B. There may be, or may not be, molding underfill and/or molding compound in package 50'.

Figure 30:
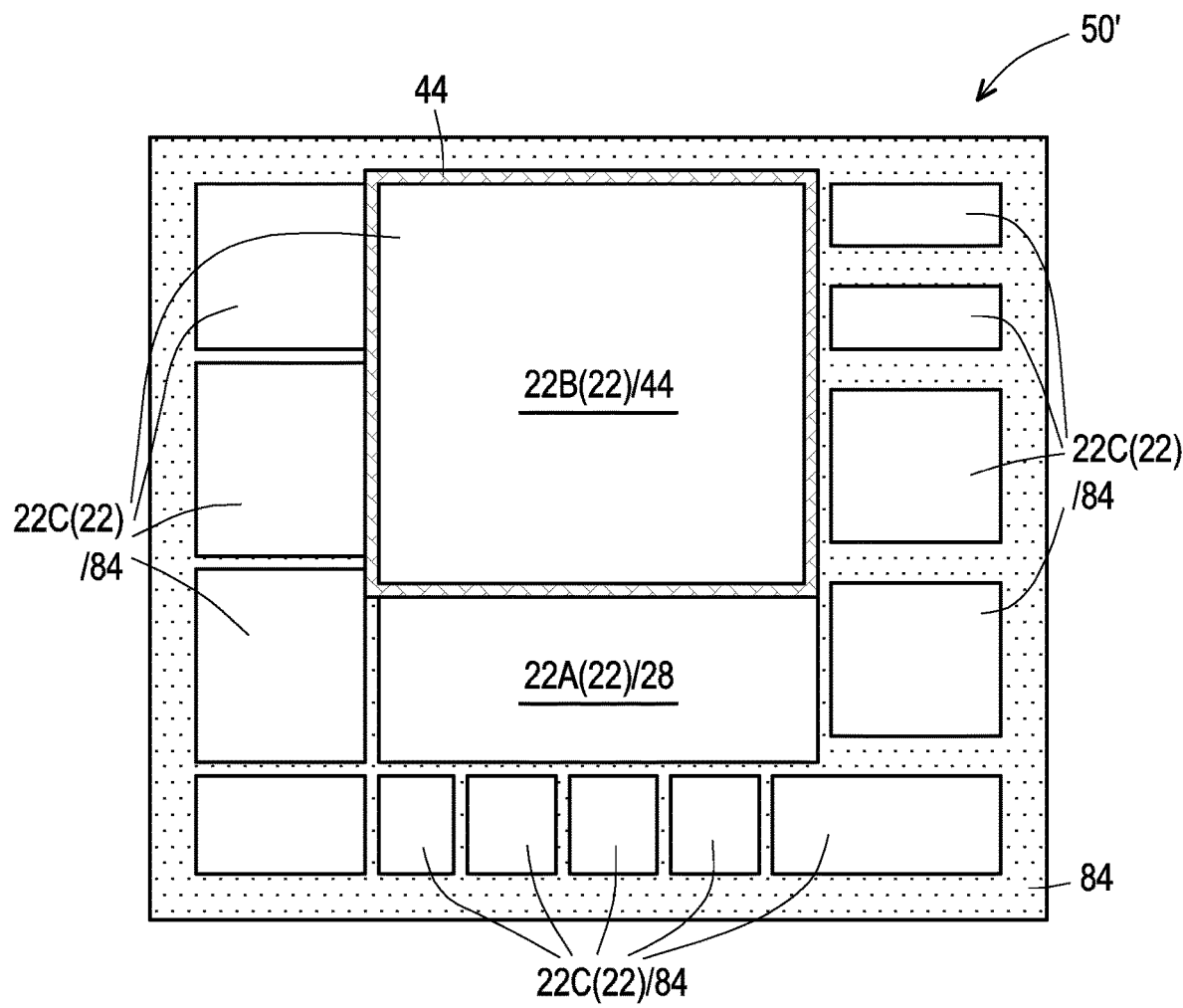
FIG. 30 illustrates a top view of a package including multiple types of underfills in accordance with some embodiments.

FIG. 30 illustrates a top view of package 50' in accordance with some embodiments. In accordance with these embodiments, NCF, capillary underfill, and molding underfill are all used. NCF 28 is underlying package component 22A. Capillary underfill 44 extends underlying and surrounds package components 22B. Molding underfill 84 extends underlying package components 22C, and further surrounds package components 22A, 22B, and 22C. There may not be any molding compound in package 50'.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. With the increase in the sizes of packages and device dies, it becomes increasingly more difficult to fully fill gaps between package components without causing voids. Also, with the increasingly greater volume and area of underfill, the warpage of packages becomes more severe due to the shrinkage of underfill during its curing process. The embodiments of the present disclosure use the mixture of different types of underfills to reduce the void problem and warpage problem. For example, NCF is solid when applied, and hence does not contribute to the shrinkage. Furthermore, some underfill such as capillary underfill may be cured first to release some stress, followed by the dispensing and the curing other types of underfill such as molding underfill.

In accordance with some embodiments of the present disclosure, a method comprises bonding a first package component over a second package component; dispensing a first underfill between the first package component and the second package component; and bonding a third package component over the second package component, wherein a second underfill is between the third package component and the second package component, and wherein the first underfill and the second underfill are different types of underfills. In an embodiment, the second underfill comprises a non-conductive film. In an embodiment, the method further comprises attaching the non-conductive film on the third package component, wherein the third package component is bonded to the second package component after the non-conductive film is attached, and wherein the non-conductive film fills a gap between the third package component and the second package component. In an embodiment, the non-conductive film is a solid film when the non-conductive film is attached. In an embodiment, the first underfill comprises a capillary underfill, and the method further comprises molding the first package component and the third package component in a molding compound. In an embodiment, the second underfill comprises a molding underfill, and the method further comprises dispensing the molding underfill between the third package component and the second package component. In an embodiment, the method further comprises attaching a non-conductive film over a fourth package component; and bonding the fourth package component over the second package component. In an embodiment, the first underfill and the second underfill have different coefficient of thermal expansion. In an embodiment, the first underfill and the second underfill are in contact with each other.

In accordance with some embodiments of the present disclosure, a package comprises a first package component; a second package component over and bonded to the first package component; a first underfill in a first gap between the second package component and the first package component; a third package component over and bonded to the first package component; and a second underfill in a second gap between the third package component and the first package component, wherein the first underfill and the second underfill are different types of underfills. In an embodiment, the first underfill comprises a capillary underfill or a molding underfill, and the second underfill comprises a non-conductive film. In an embodiment, the first underfill comprises a first extension portion outside of the first gap, and the first extension portion comprises a concave sidewall, and the second underfill comprises a second extension portion outside of the second gap, and the second extension portion comprises a convex and curved sidewall. In an embodiment, the package further comprises a molding compound molding the second package component and the third package component therein, wherein the molding compound has a composition different from compositions of the first underfill and the second underfill. In an embodiment, the package further comprises a fourth package component over and bonded to the first package component; and a third underfill in a third gap between the fourth package component and the first package component, wherein the first underfill, the second underfill, and the third underfill are different types of underfills. In an embodiment, the first underfill physically contacts the second underfill.

In accordance with some embodiments of the present disclosure, a package comprises an interposer; a first die bonding to the interposer through a first plurality of bumps; a second die bonding to the interposer through a second plurality of bumps; a first underfill layer comprising a first portion between the first die and the interposer, wherein the first underfill layer surrounds the first plurality of bumps; a second underfill layer comprising a second portion between the second die and the interposer, wherein the second underfill layer surrounds the second plurality of bumps, and wherein a first CTE of the first underfill layer is different from a second CTE of the second underfill layer; and an encapsulant encapsulating the first die and the second die, wherein the encapsulant further surrounds the first underfill layer and the second underfill layer. In an embodiment, the encapsulant comprises a material different from materials of both of the first underfill layer and the second underfill layer. In an embodiment, the first underfill layer is different from the encapsulant, and the second underfill layer is same as the encapsulant. In an embodiment, the first underfill layer and the second underfill layer further comprise extend portions physically contacting with each other to form a distinguishable interface. In an embodiment, the first underfill layer comprises a concave sidewall, and the second underfill layer comprises a convex sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first package component over a second package component;
    dispensing a first underfill between the first package component and the second package component, wherein the first underfill comprises a capillary underfill;
    bonding a third package component over the second package component, wherein a second underfill is between the third package component and the second package component, and wherein the second underfill comprises a first non-conductive film, and wherein both of the first underfill and the second underfill directly contact a top surface of the second package component;
    attaching a second non-conductive film on a fourth package component;
    after the second non-conductive film has been attached to the fourth package component, placing the fourth package component over the second package component, with the second non-conductive film being in physical contact with the fourth package component, wherein solder regions of the fourth package component are fully inside the second non-conductive film, and the solder regions are spaced apart from the second package component by a layer of the second non-conductive film; and
    bonding the fourth package component over the second package component, wherein the solder regions penetrate through the layer of the second non-conductive film to join the second package component.

2. The method of claim 1, wherein the capillary underfill comprises a portion overlapping a portion of the first non-conductive film.

3. The method of claim 1 further comprising:
    attaching the first non-conductive film on the third package component, wherein the third package component is bonded to the second package component after the first non- conductive film is attached, and wherein the first non-conductive film fills a gap between the third package component and the second package component.

4. The method of claim 3, wherein the first non-conductive film is a solid film when the first non-conductive film is attached.

5. The method of claim 1 further comprising molding the first package component and the third package component in a molding compound.

6. The method of claim 5, wherein the second underfill comprises a molding underfill, and the method further comprises dispensing the molding underfill between the third package component and the second package component.

7. The method of claim 1, wherein the first underfill and the second underfill have different coefficient of thermal expansion.

8. The method of claim 1, wherein the first underfill and the second underfill are in direct contact with each other.

9. A method comprising:
    attaching a non-conductive film to a first package component;
    after the non-conductive film is attached to the first package component, bonding the first package component over a second package component, wherein electrical connectors of the first package component penetrate through the non-conductive film to electrically connect to the second package component, and wherein the non-conductive film fills a first gap between the second package component and the first package component;
    bonding a third package component to the second package component;
    dispensing a underfill in a second gap between the third package component and the first package component, wherein the underfill is different from the non-conductive film, and wherein the underfill directly contacts the non-conductive film to form an interface, and wherein a portion of the underfill is in the second gap and contacts a first sidewall of the first package component and a second sidewall of the third package component; and
    dispensing a molding compound into the second gap, wherein the molding compound is over and contacting the portion of the underfill in the second gap.

10. The method of claim 9, wherein the underfill comprises a capillary underfill or a molding underfill.

11. The method of claim 10, wherein the underfill comprises a first extension portion outside of the second gap, and the first extension portion comprises a concave sidewall, and the non-conductive film comprises a second extension portion outside of the first gap, and the second extension portion comprises a convex and curved sidewall.

12. The method of claim 10, wherein the molding compound encapsulates the underfill, the non-conductive film, and the first package component and the third package component therein, wherein the molding compound has a composition different from compositions of both of the underfill and the non-conductive film.

13. The method of claim 9 further comprising:
    before the first package component is bonded over the second package component, placing the first package component over the second package component, wherein the electrical connectors of the first package component are in the non-conductive film and spaced apart from the second package component by a layer of the non-conductive film; and
    pressing the first package component against the second package component, so that the electrical connectors penetrate through the layer of the non-conductive film to electrically connect to the second package component.

14. The method of claim 9, wherein the underfill directly contacts a sidewall of the first package component.

15. A method comprising:
    pressing a first underfill layer that is solid onto a wafer, wherein the wafer comprises a first die, and wherein a first plurality of solder regions of the first die is pressed partially into the first underfill layer;

sawing the wafer to separate the first die from other dies in the wafer;

bonding the first die to an interposer through the first plurality of solder regions, wherein a first portion of the first underfill layer is located between the first die and the interposer, and wherein the first underfill layer surrounds the first plurality of solder regions;

bonding a second die to the interposer through a second plurality of solder regions;

dispensing a second underfill layer between the second die and the interposer, wherein the second underfill layer surrounds the second plurality of solder regions, wherein the first underfill layer is attached to the first die before the first die is bonded to the interposer, and the second underfill layer is dispensed after the second die is bonded to the interposer; and dispensing an encapsulant to encapsulate the first die and the second die therein, wherein the encapsulant further surrounds the first underfill layer and the second underfill layer.

16. The method of claim 15, wherein the encapsulant comprises a material different from materials of both of the first underfill layer and the second underfill layer.

17. The method of claim 15 further comprising pressing the first die against the interposer, so that the first plurality of solder regions of the first die penetrate through a layer of the first underfill layer that is solid to penetrate through the first underfill layer.

18. The method of claim 15, wherein the second underfill layer comprises a capillary underfill that is dispensed through capillary, and the first underfill layer is a non-conductive film.

19. The method of claim 18, wherein the capillary underfill further extends to a top surface of the first die.

* * * * *